United States Patent
Cui et al.

(10) Patent No.: US 11,361,816 B2
(45) Date of Patent: Jun. 14, 2022

(54) MEMORY BLOCK WITH SEPARATELY DRIVEN SOURCE REGIONS TO IMPROVE PERFORMANCE

(71) Applicant: SanDisk Technologies LLC, Addison, TX (US)

(72) Inventors: Zhixin Cui, Nagoya (JP); Rajdeep Gautam, Yokohama (JP); Hardwell Chibvongodze, Hiratsuka (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/996,412

(22) Filed: Aug. 18, 2020

(65) Prior Publication Data
US 2022/0059157 A1    Feb. 24, 2022

(51) Int. Cl.
| G11C 11/4094 | (2006.01) |
| G11C 11/4093 | (2006.01) |
| G11C 5/02 | (2006.01) |
| G11C 11/408 | (2006.01) |
| G11C 11/4074 | (2006.01) |

(52) U.S. Cl.
CPC .......... *G11C 11/4094* (2013.01); *G11C 5/025* (2013.01); *G11C 11/4074* (2013.01); *G11C 11/4085* (2013.01); *G11C 11/4093* (2013.01)

(58) Field of Classification Search
CPC ............ G11C 11/4094; G11C 11/4074; G11C 11/4085; G11C 11/4093; G11C 5/025
USPC ..................................................... 365/185.13
See application file for complete search history.

(56) References Cited

U.S. PATENT DOCUMENTS

| 5,990,509 A | * | 11/1999 | Burns, Jr ......... H01L 27/10897 257/296 |
| 7,852,675 B2 | | 12/2010 | Maejima |
| 9,209,031 B2 | | 12/2015 | Baenninger et al. |
| 9,911,748 B2 | | 3/2018 | Nishikawa et al. |
| 9,959,932 B1 | | 5/2018 | Zhang et al. |

(Continued)

FOREIGN PATENT DOCUMENTS

| KR | 10-2014-0089792 A | 7/2014 |
| WO | WO2015041824 A2 | 3/2015 |

OTHER PUBLICATIONS

U.S. Appl. No. 16/432,304, filed Jun. 5, 2019.
(Continued)

*Primary Examiner* — Connie C Yoha
(74) *Attorney, Agent, or Firm* — Vierra Magen Marcus LLP

(57) ABSTRACT

Apparatuses and techniques are described for providing separate source regions in the substrate below a block of memory cells. The source regions can be separately driven by respective voltage drivers to provide benefits such as more uniform program and erase speeds and narrower threshold voltage distributions. In one approach, a single source region is provided and divided into multiple source regions by etching trenches and filling the trenches with an insulating material. Contacts to the source regions can include post-shaped contacts which extend through the block for each source region. In another approach, one or more planar contacts extend through the block for each source region. In another aspect, a program operation applies different voltages to the respective source regions during a verify test of a program operation.

20 Claims, 26 Drawing Sheets

(56) References Cited

U.S. PATENT DOCUMENTS

| | | |
|---|---|---|
| 10,056,399 B2 | 8/2018 | Costa et al. |
| 10,636,487 B2 | 4/2020 | Yang et al. |
| 2011/0151667 A1 | 6/2011 | Hwang et al. |
| 2015/0194435 A1 | 7/2015 | Lee |
| 2016/0141301 A1 | 5/2016 | Mokhlesi et al. |
| 2016/0233224 A1* | 8/2016 | Rhie ................. H01L 27/11582 |
| 2016/0284723 A1 | 9/2016 | Rabkin et al. |
| 2017/0125433 A1* | 5/2017 | Ogawa .............. H01L 27/11565 |

OTHER PUBLICATIONS

International Search Report & The Written Opinion of the International Searching Authority dated Oct. 28, 2021, International Application No. PCT/US2021/033706.

* cited by examiner

Fig. 1A
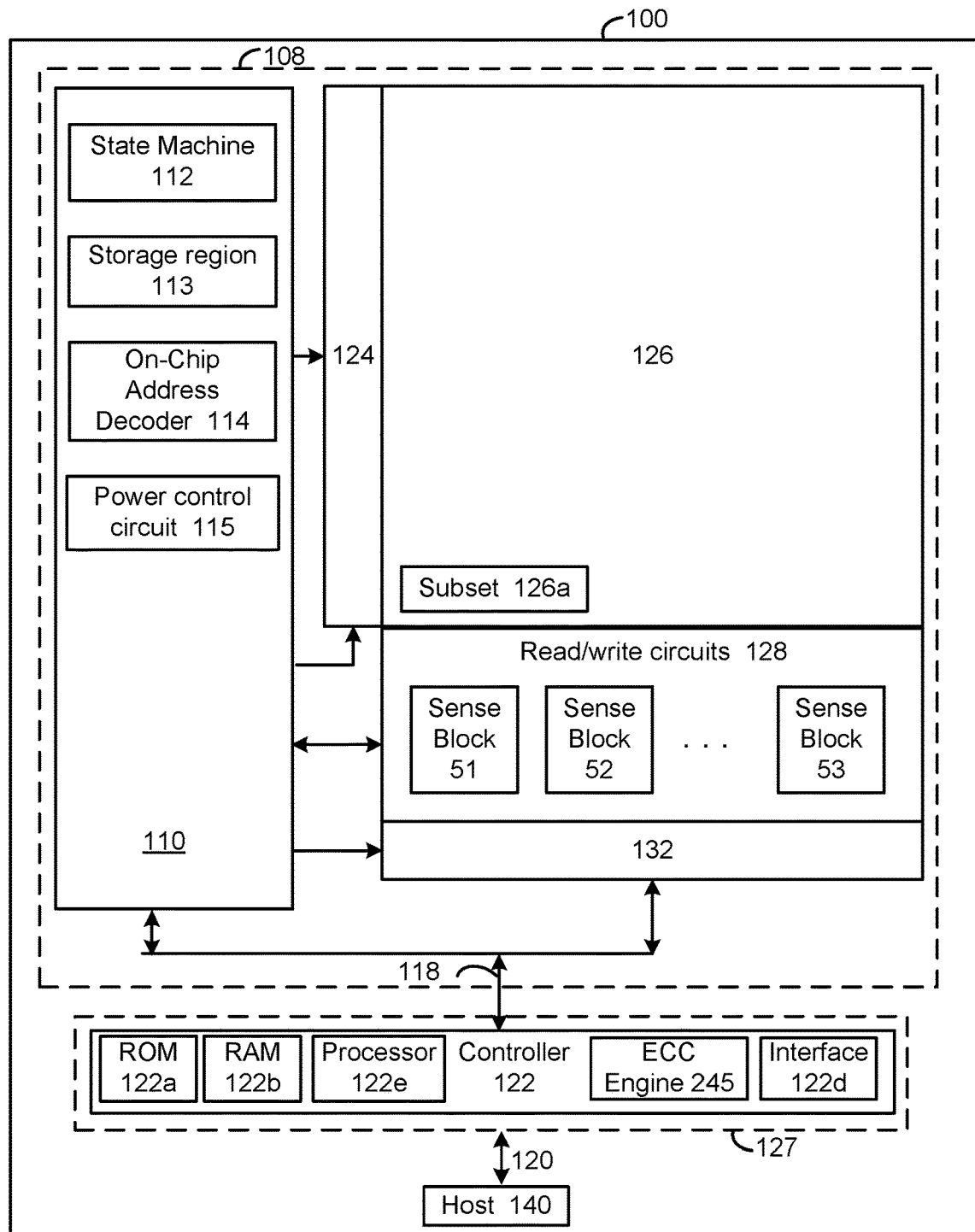
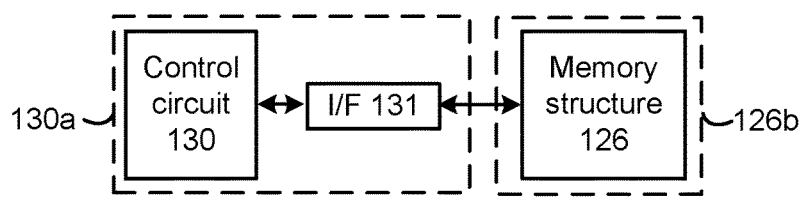
Fig. 1B

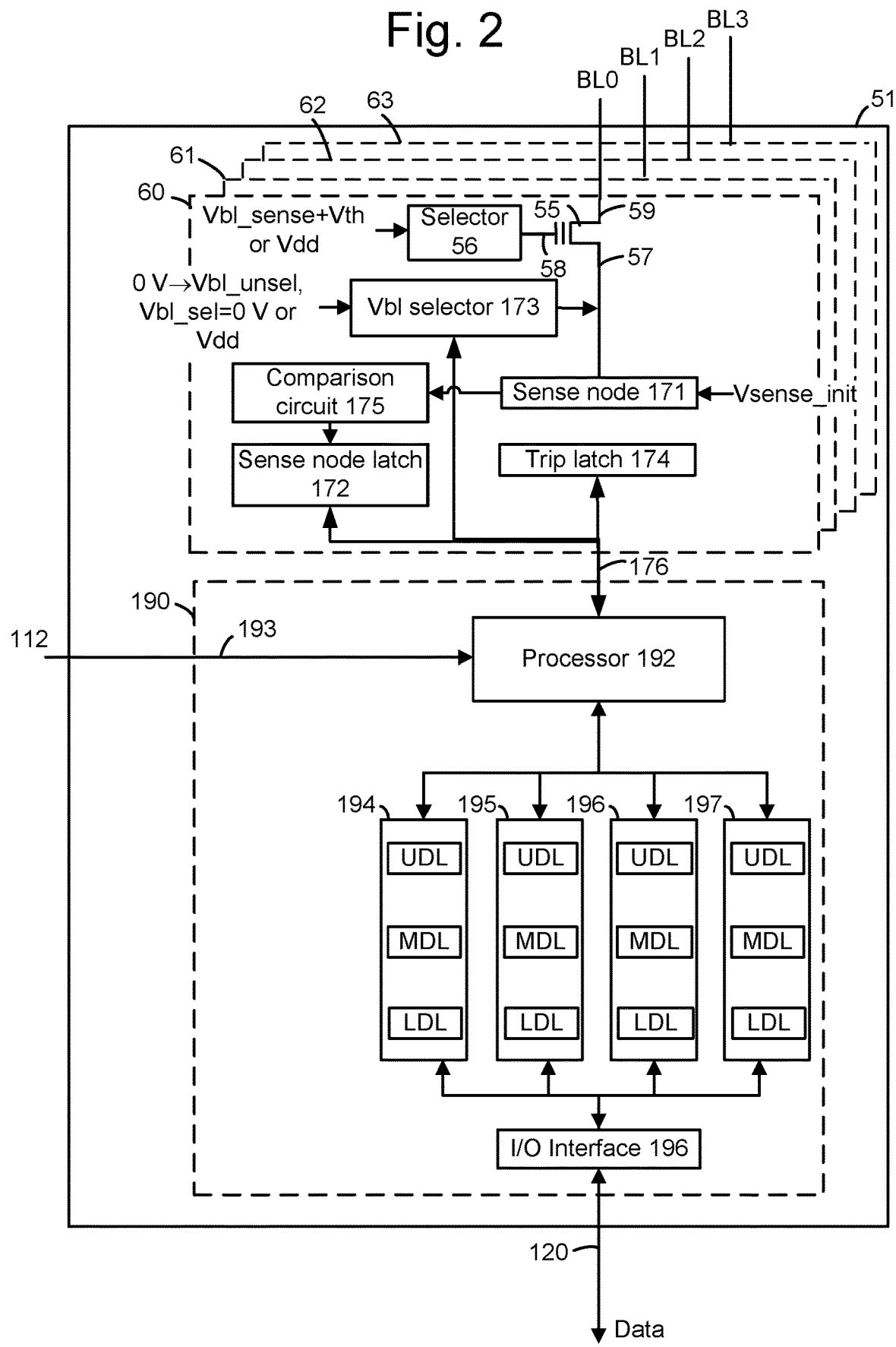

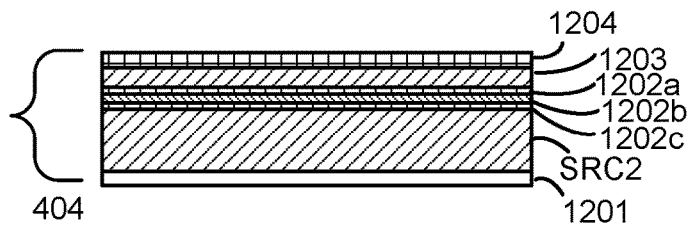
Fig. 12C
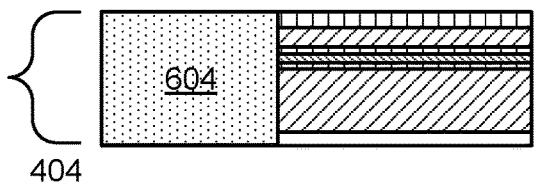
Fig. 12D
Fig. 12E
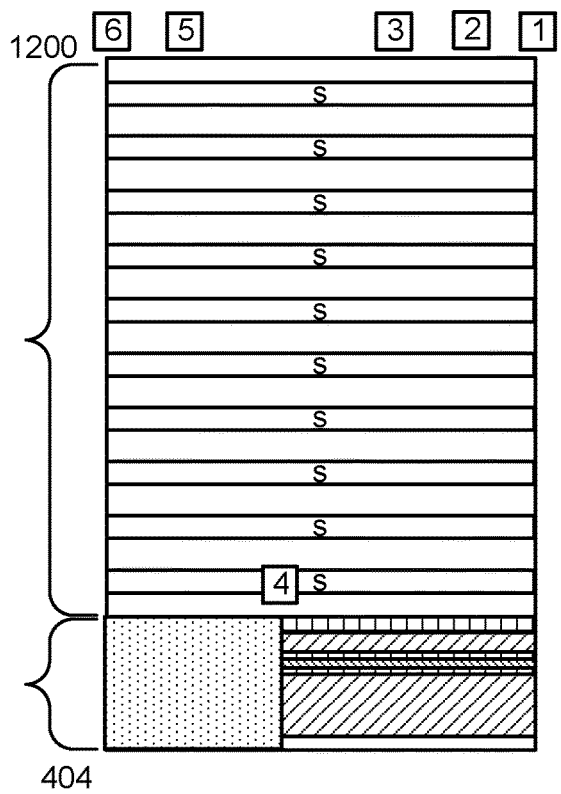
Fig. 12F
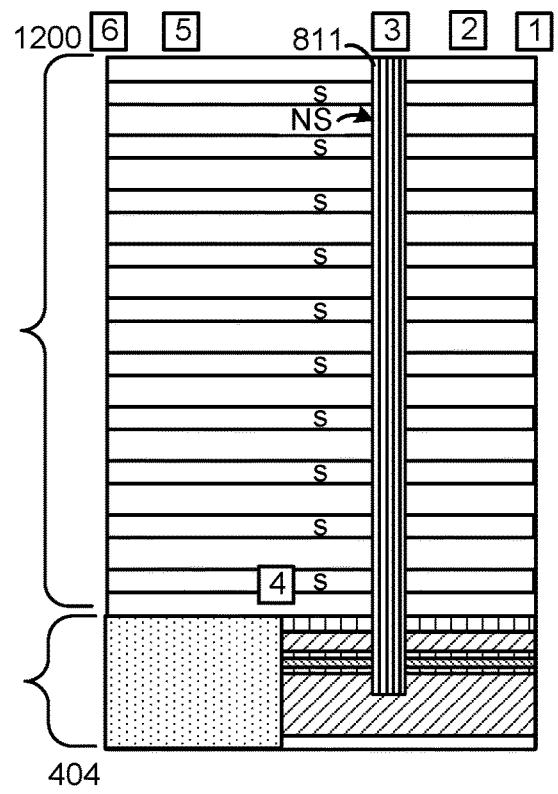

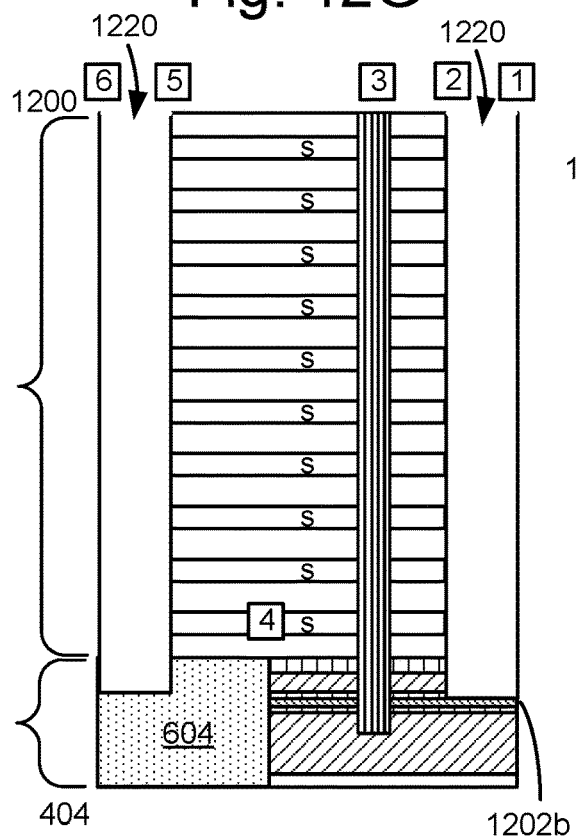
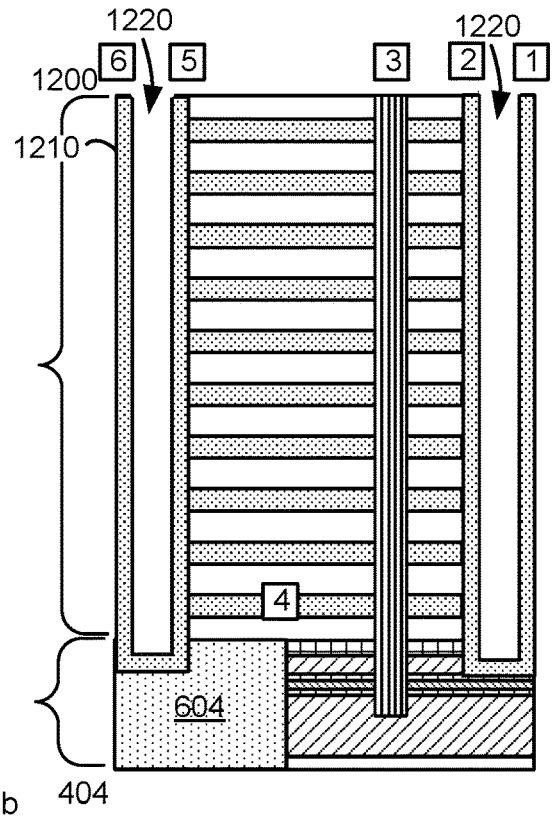
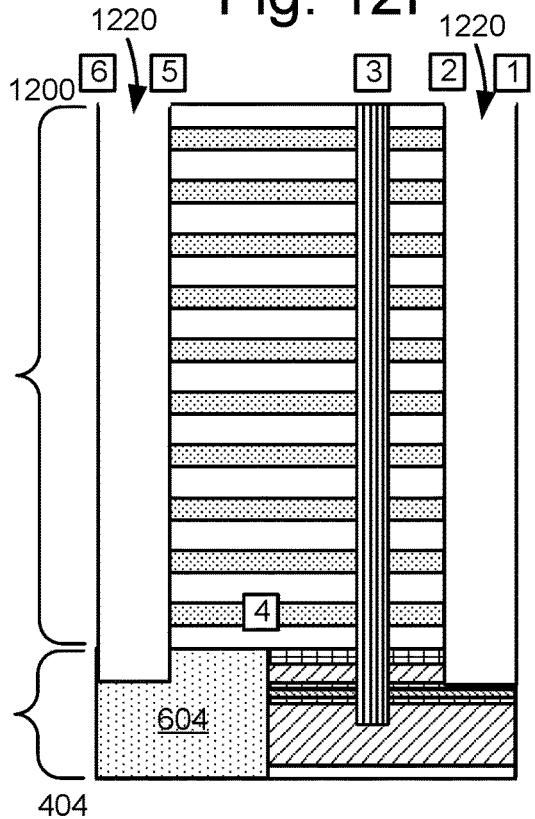

Fig. 13D
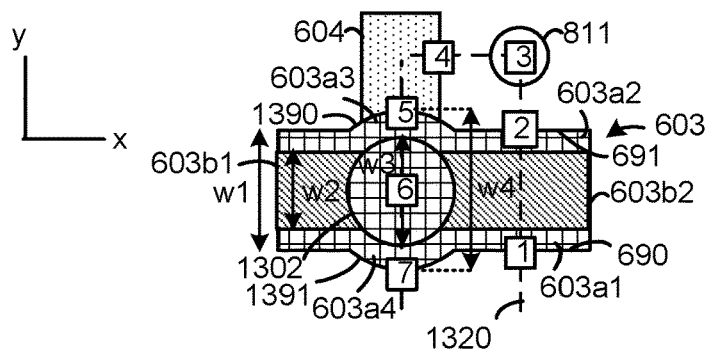
Fig. 13E
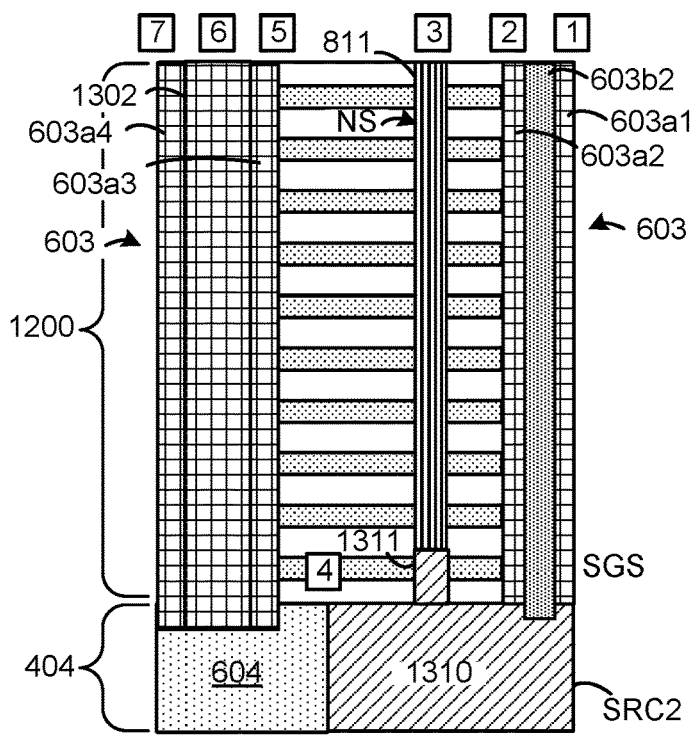
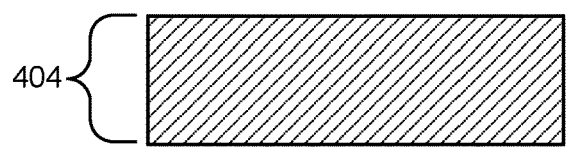
Fig. 13F
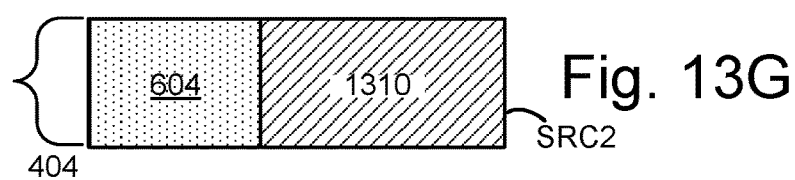
Fig. 13G

Fig. 13H
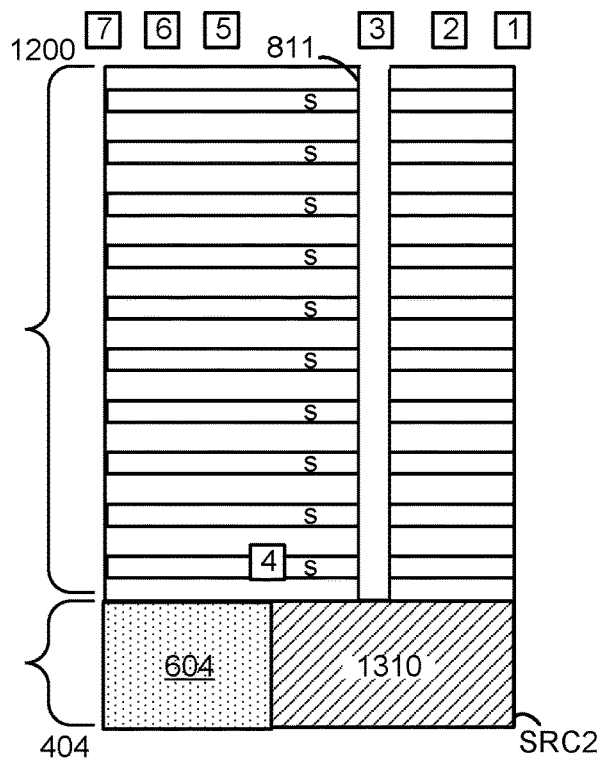
Fig. 13I
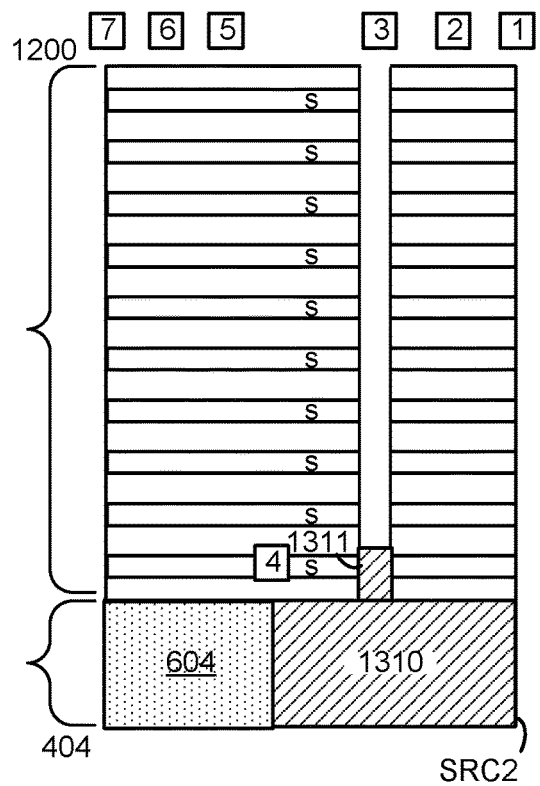
Fig. 13J1
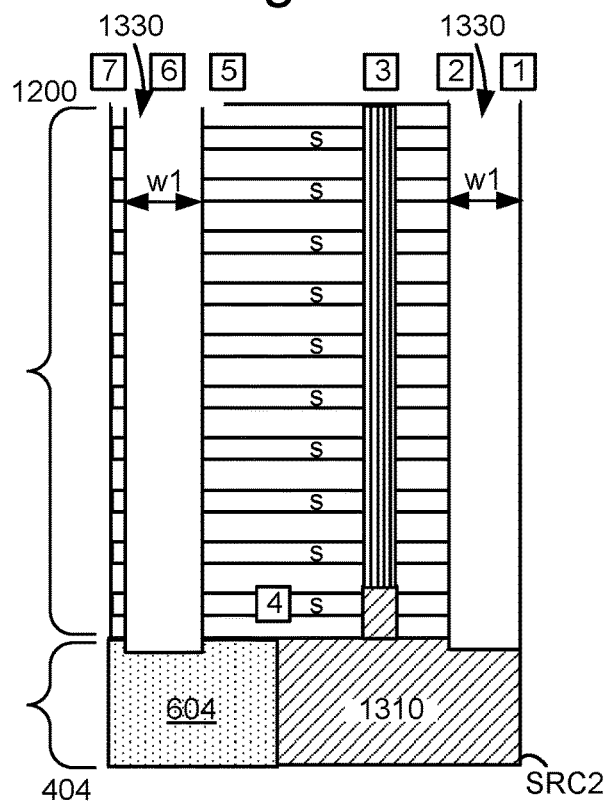
Fig. 13J2
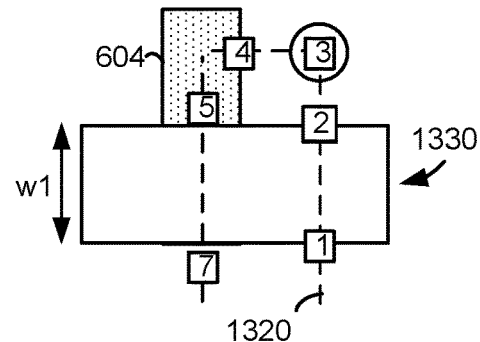

Fig. 13J3
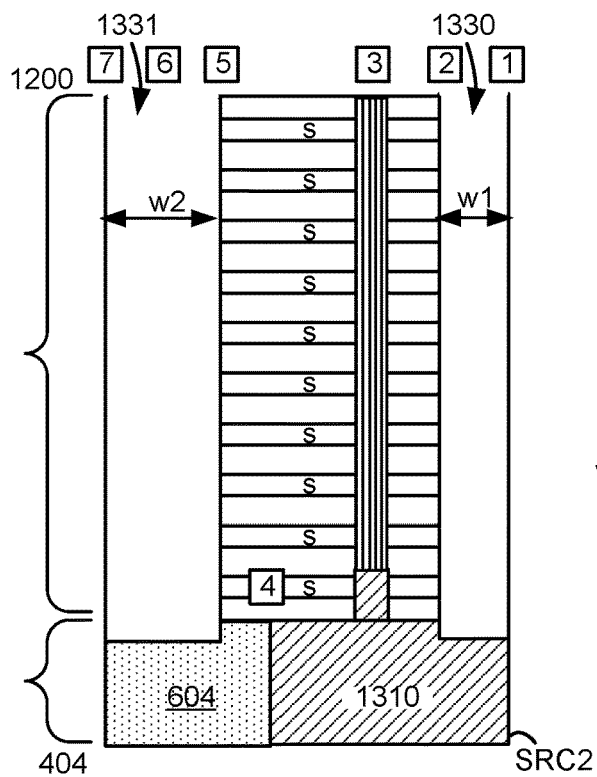
Fig. 13J4
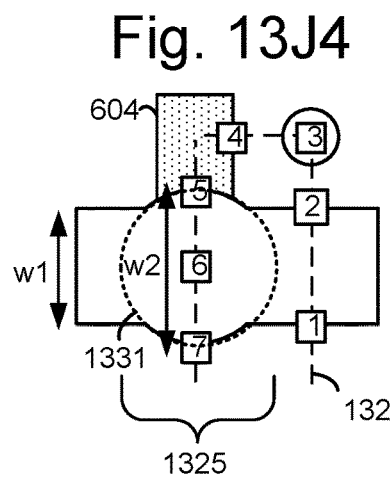
Fig. 13K
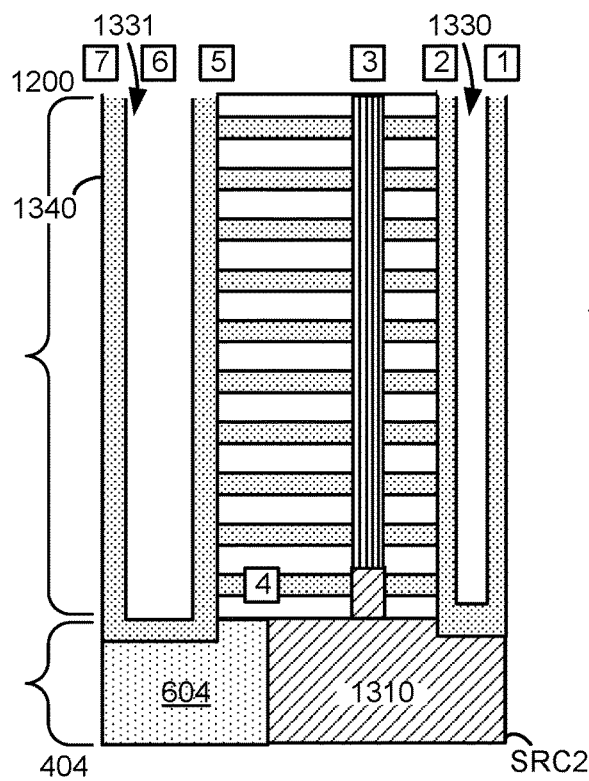
Fig. 13K1
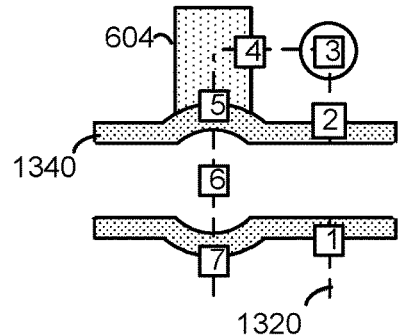

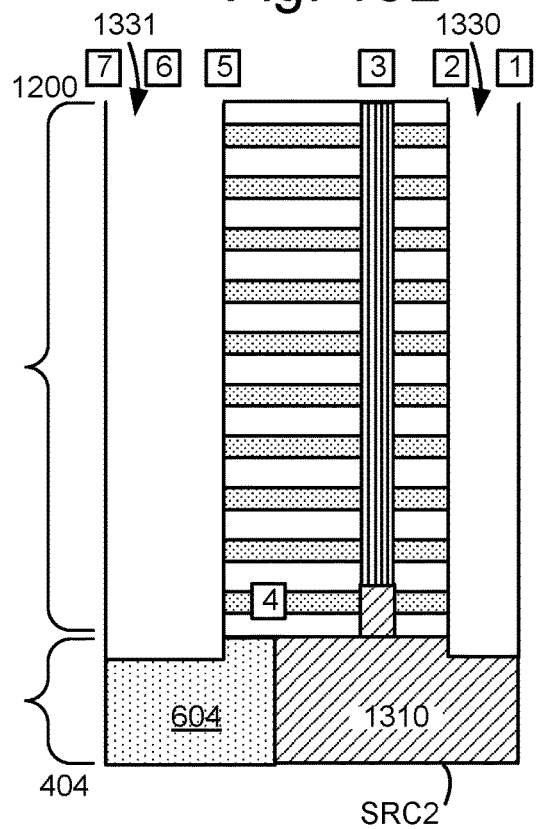
Fig. 13L
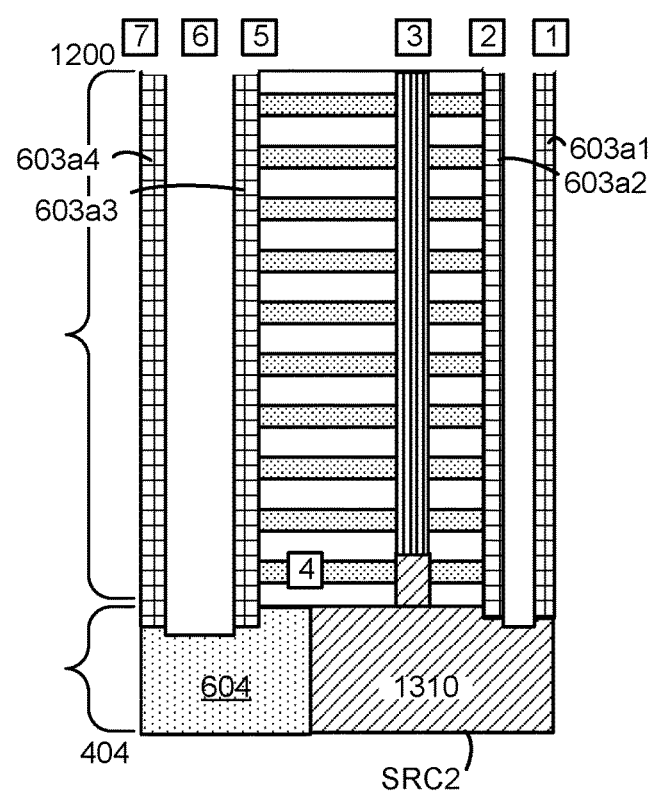
Fig. 13M
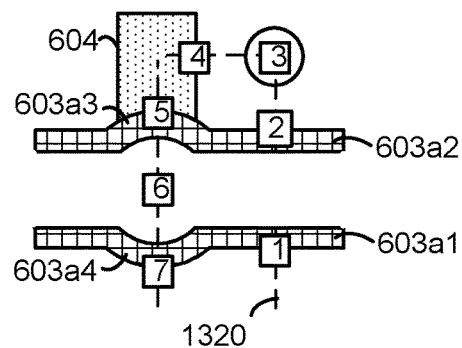
Fig. 13M1

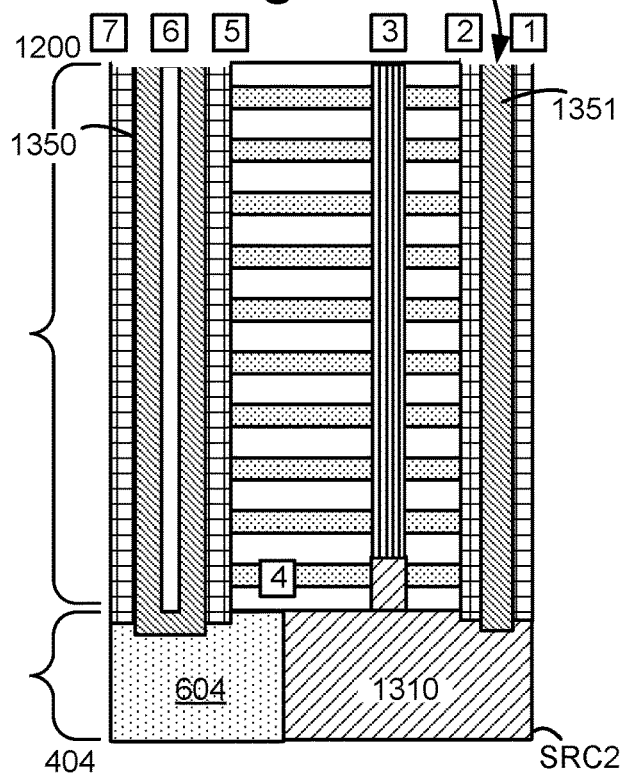
Fig. 13N
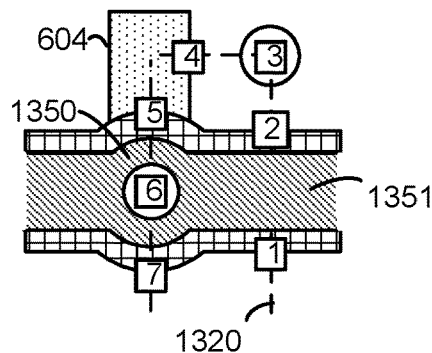
Fig. 13N1
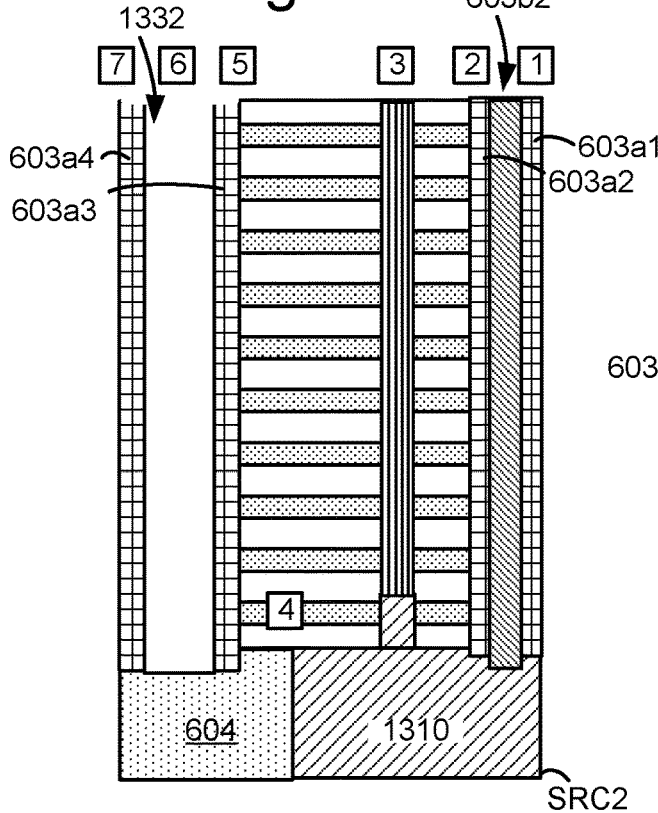
Fig. 13O
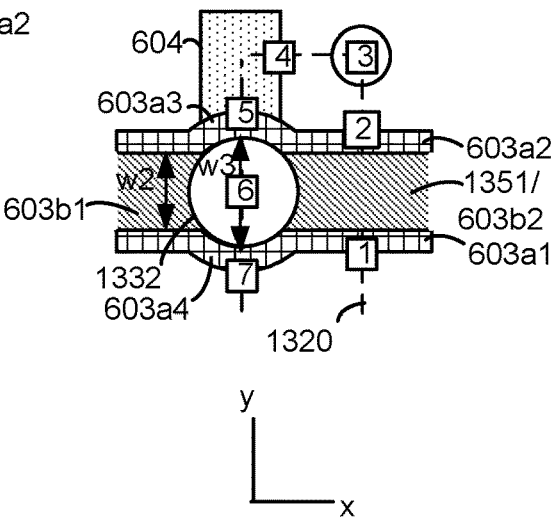
Fig. 13O1

MEMORY BLOCK WITH SEPARATELY DRIVEN SOURCE REGIONS TO IMPROVE PERFORMANCE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. For example, a charge-trapping material can be arranged vertically in a three-dimensional (3D) stacked memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 2 is a block diagram depicting one embodiment of the sense block 51 of FIG. 1A.

FIG. 12C depicts an initial configuration of a block region consistent with FIG. 12B, where the substrate 404 is formed.

FIG. 12D depicts a configuration of a block region which follows the configuration of FIG. 12C, where an insulation region is formed in the substrate.

FIG. 12E depicts a configuration of a block region which follows the configuration of FIG. 12D, where a stack of layers is formed on the substrate.

FIG. 12F depicts a configuration of a block region which follows the configuration of FIG. 12E, where a memory hole and NAND string are formed in the stack.

FIG. 12G depicts a configuration of a block region which follows the configuration of FIG. 12F, where a trench is formed in the stack.

FIG. 12H depicts a configuration of a block region which follows the configuration of FIG. 12G, where a metal is deposited in the layers of the stack via the trench.

FIG. 12I depicts a configuration of a block region which follows the configuration of FIG. 12H, where the metal is removed from the trench.

FIG. 13D depicts a detail of a region of the block of FIG. 13A along the path 1320.

FIG. 13E depicts a cross-sectional view of the block region of FIG. 13D along the path 1320 in an Example II(A).

FIG. 13F depicts an initial configuration of a block region consistent with FIG. 12B, where a substrate of crystalline silicon is formed.

FIG. 13G depicts a configuration of a block region which follows the configuration of FIG. 13F, where an insulation region is formed in the substrate.

FIG. 13H depicts a configuration of a block region which follows the configuration of FIG. 13G, where a stack of layers is formed on the substrate and a memory hole is formed in the stack.

FIG. 13I depicts a configuration of a block region which follows the configuration of FIG. 13H, where an epitaxial region is formed at the bottom of the memory hole.

FIG. 13J1 depicts a configuration of a block region which follows the configuration of FIG. 13I, where a trench is formed in the stack.

FIG. 13J2 depicts a top view of the block region of FIG. 13J1.

FIG. 13J3 depicts a configuration of a block region which follows the configuration of FIG. 13J1, where an outer post-shaped void is formed to provide a widened portion of the trench.

FIG. 13J4 depicts a top view of the block region of FIG. 13J3.

FIG. 13K depicts a configuration of a block region which follows the configuration of FIG. 13J3, where a metal is deposited in the layers of the stack via the trench 1330 and the outer post-shaped void 1331.

FIG. 13K1 depicts a top view of the block region of FIG. 13K.

FIG. 13L depicts a configuration of a block region which follows the configuration of FIG. 13K, where the metal is removed from the trench.

FIG. 13M depicts a configuration of a block region which follows the configuration of FIG. 13L, where an insulation layer is deposited in the trench.

FIG. 13M1 depicts a top view of the block region of FIG. 13M.

FIG. 13N depicts a configuration of a block region which follows the configuration of FIG. 13M, where a conductive material is deposited in the trench.

FIG. 13N1 depicts a top view of the block region of FIG. 13N.

FIG. 13O depicts a configuration of a block region which follows the configuration of FIG. 13N, where an inner post-shaped void is formed to remove a portion of the conductive material in the widened region of the trench, thereby forming a separate planar contact for each source region of the block.

FIG. 13O1 depicts a top view of the block region of FIG. 13O.

DETAILED DESCRIPTION

Apparatuses and techniques are described for providing a memory block with separately driven source regions. Performance can be improved such as by providing narrower threshold voltage distributions.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of an upright cylinder which intersects with the word lines to form the memory cells. Further, each NAND string includes various layers which extends vertically in the stack. A source end of the NAND string is connected to a source region in the substrate and a drain end of the NAND string is connected to a bit line. For example, see FIG. 5A-5C.

In a 2D memory structure, the memory cells may be arranged in horizontal NAND strings on a substrate.

There is a continuing desire to scale down such memory devices to improve performance, increase volume and decrease cost. However, it is difficult to maintain a consistent performance. For example, variations in program and erase speed occur across a block of memory cells based on the distance of a NAND string from a row decoder which provides a driving voltage. One potential solution is to reduce the page size below the standard 16 kB page size. In this case, a block of memory cells can be divided into separate smaller blocks, although this increases chip size and reduces customizability. Another potential solution is to develop process improvements which reduce variations in resistance and capacitance across the word lines of a block. The use of row decoders on opposing sides of the block can also be helpful.

Figure 6A:
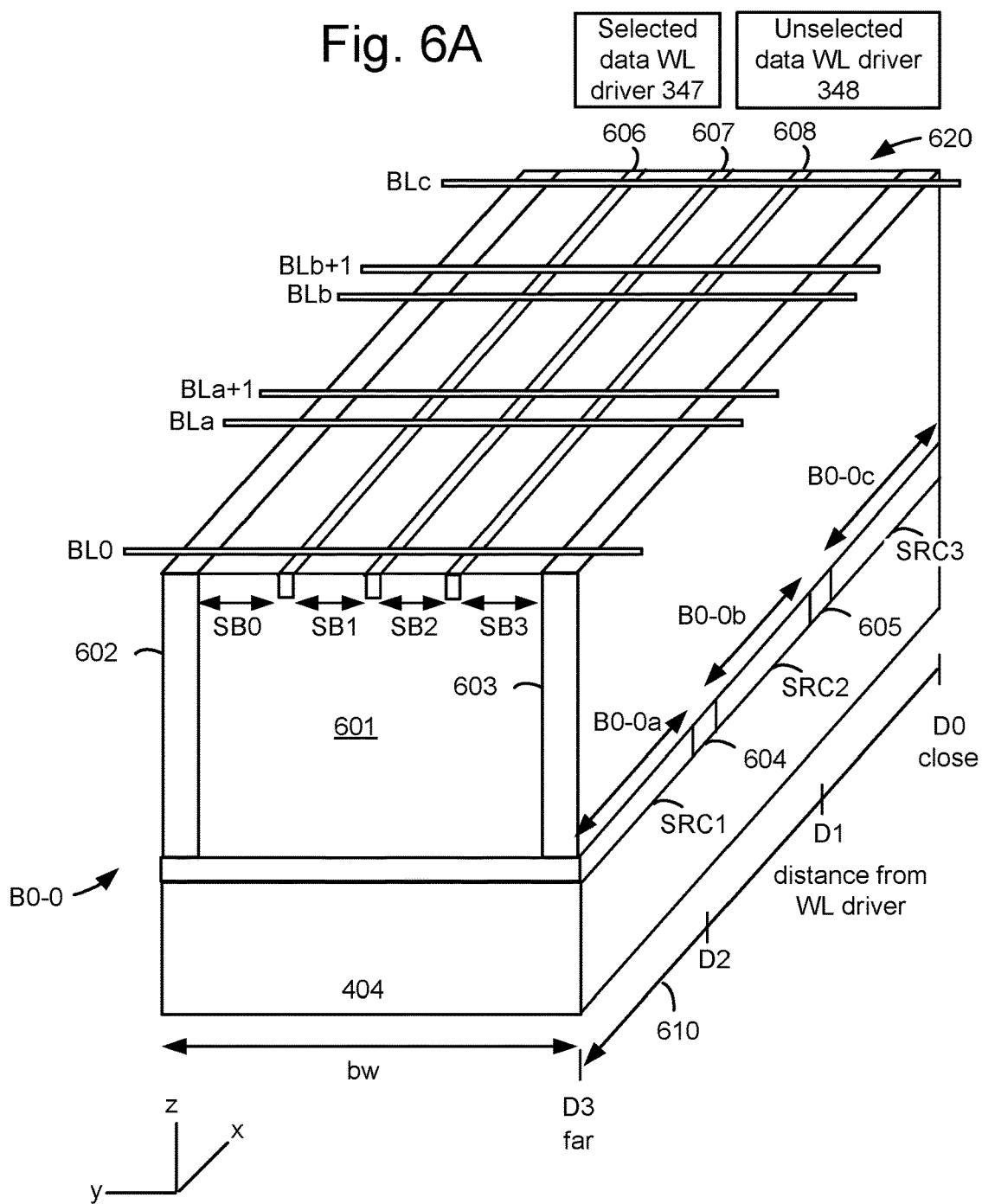
FIG. 6A depicts an example configuration of the block B0-0 of FIG. 4A, showing separate source regions SRC1, SRC2 and SRC3 in the substrate 404.
Figure 13A:
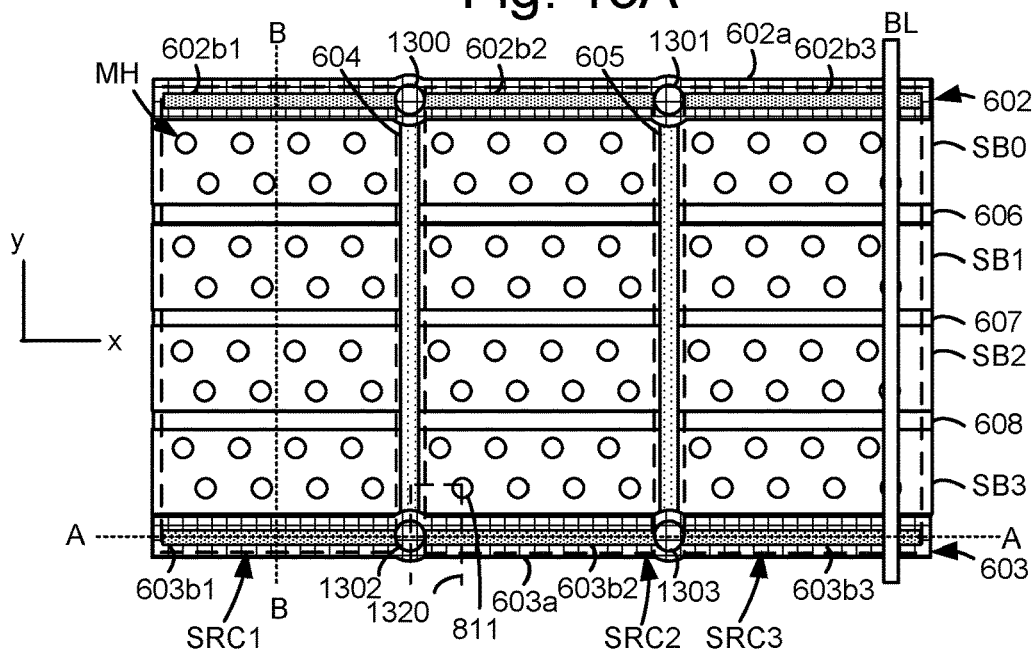
FIG. 13A depicts a top view of the block of FIG. 6A, in an Example II in which different planar contacts to the source regions are provided at the edges of the block.

Techniques provided herein address the above and other issues. In one aspect, separate source regions are provided in the substrate below a block. The source regions can be separately driven by respective voltage drivers to provide benefits such as more uniform program and erase speeds and narrower threshold voltage distributions. In one approach, a single source region is provided and divided into multiple source regions SRC1-SRC3 by etching trenches and filling the trenches with an insulating material to provide insulating regions 604 and 605 (FIG. 6A). Contacts to the source regions can be provided in different ways. The contacts extend from above the block to the substrate to provide a conductive path to the source regions for carrying voltage signals. For example, one or more post-shaped contacts 801-806 (FIG. 8A) can extend through the block for each source region. Post-shaped contacts 900, 905 and 910 can also extend through the block in a lateral region 920 of the block. In another approach, one or more planar contacts 602b1-602b3 and 603b1-603b3 (FIG. 13A) extend through the block for each source region. A single planar contact can be formed in trenches along opposing long edges of the block and divided into separate contacts by etching post-shaped voids 1332 (FIG. 13O1) through the trenches and filling the post-shaped voids with insulation 1302 (FIG. 13D).

Figure 18:
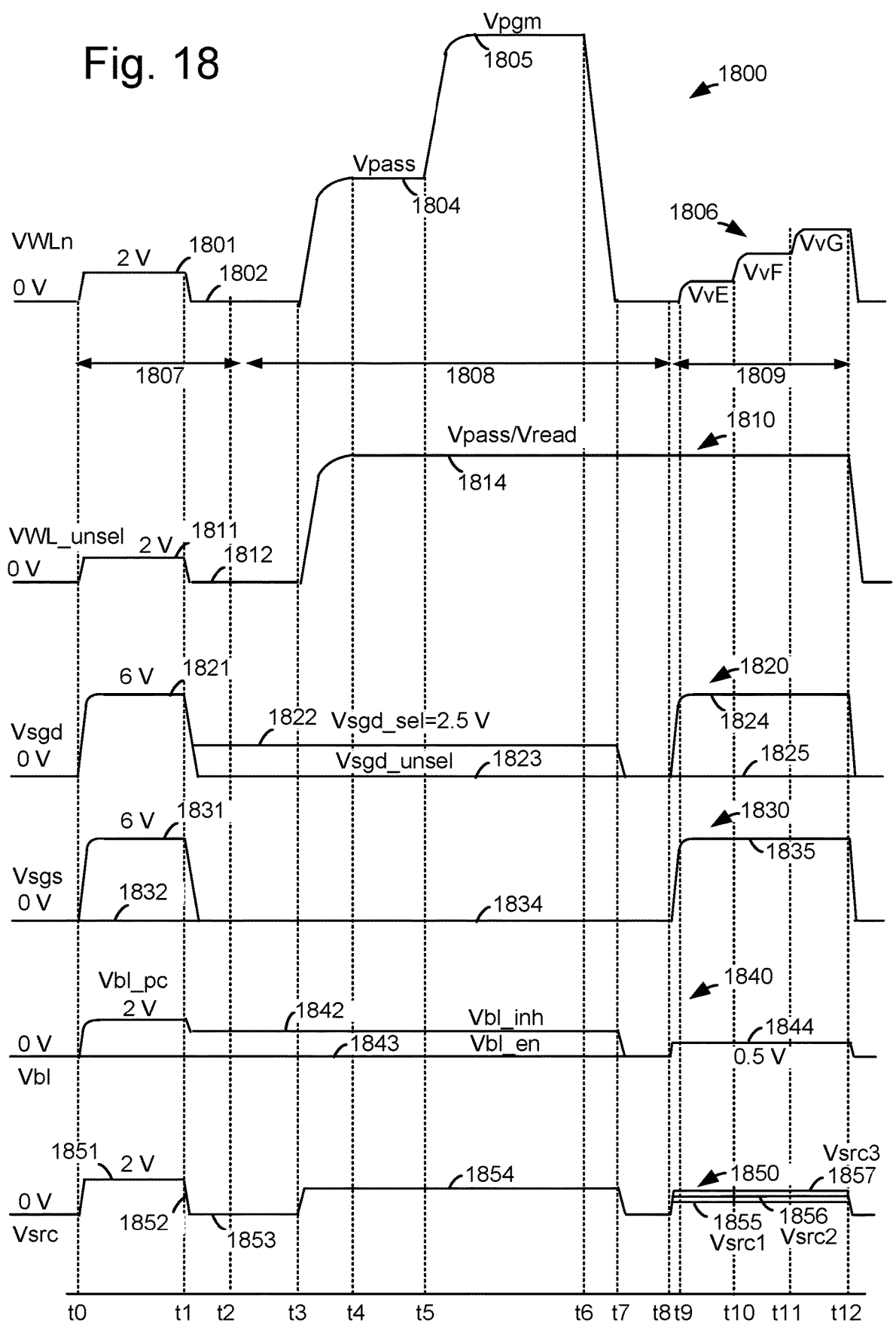
FIG. 18 depicts example voltage signals for performing a program operation using different source region voltages, consistent with FIG. 16.

In another aspect, a program operation applies different voltages Vsrc1-Vsrc3 to the respective source regions during a verify test of a program operation (FIG. 18).

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control circuit 115. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. The sense circuit performs sensing by determining whether a conduction current in a connected bit line is above or below a predetermined threshold level. This indicates whether the Vth of the memory cell is below or above, respectively, the word line voltage.

The sense circuit 60 also operates in a disable operation as described at the outset for permanently increasing the threshold voltage of select gate transistors to prevent access to memory cells. The sense circuit determines whether the Vth of the select gate transistors is above a verify voltage, Vverify, applied to the control gates of the select gate transistors.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg–Vth, where Vcg is the voltage on the control gate 58 and Vth, e.g., 1 V, is the threshold voltage of the transistor 55. This assumes the source line is at 0 V. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the transistor 55 to provide Vbl_sense, e.g., 0.5 V, on the bit line. A Vbl selector 173 may pass a relatively high voltage such as Vdd to the drain 57, which is higher than the control gate voltage on the transistor 55, to provide the source-follower mode during sensing operations.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
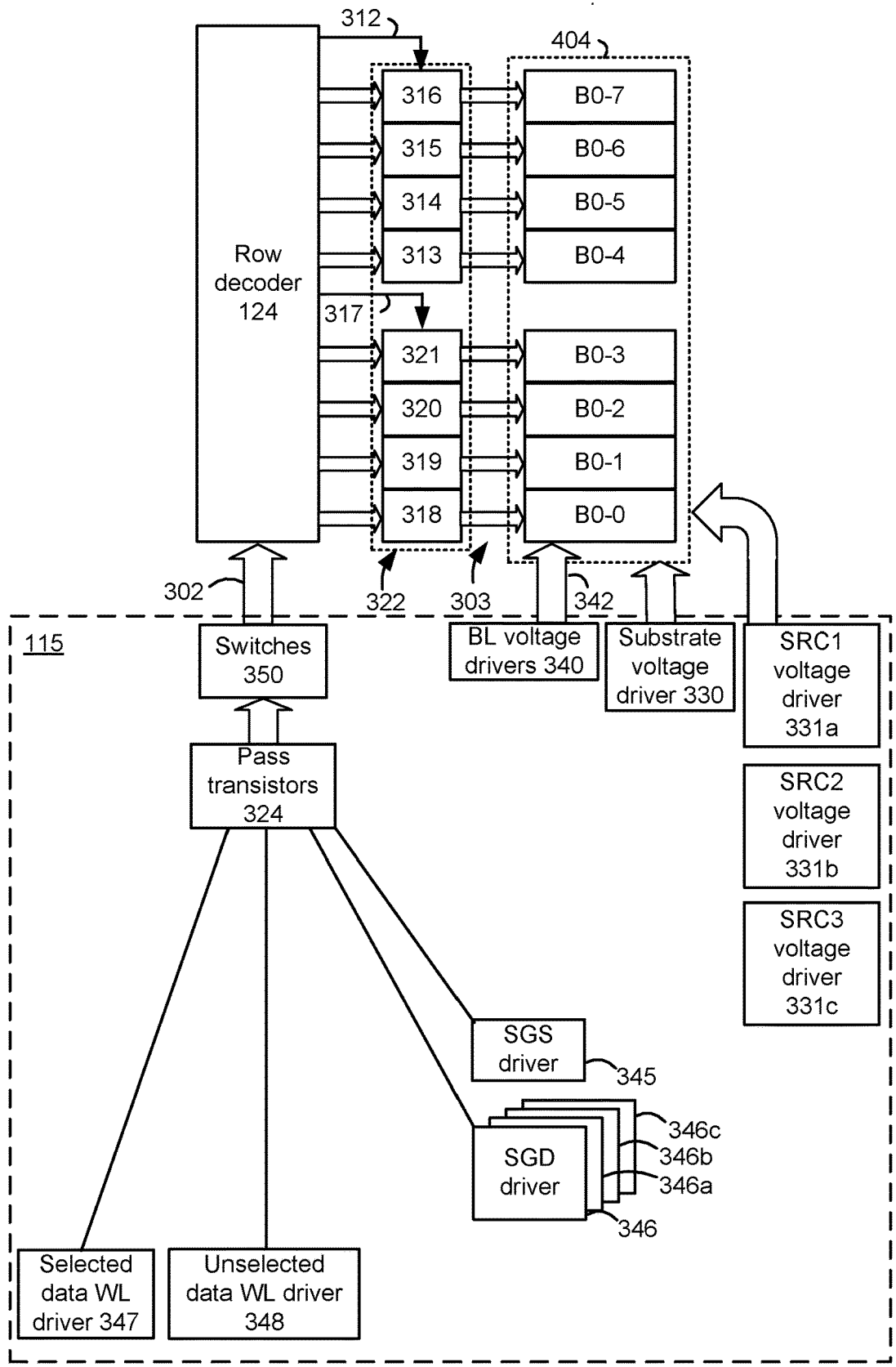
FIG. 3 depicts an example implementation of the power control circuit 115 of FIG. 1A for providing voltages to blocks of memory cells in a plane.

FIG. 3 depicts an example implementation of the power control circuit 115 of FIG. 1A for providing voltages to blocks of memory cells in a plane. The circuitry shown can be repeated for each plane of a die, in one approach. In this example, the memory structure 126 includes a set of four related blocks, B0-0 to B0-3, and another set of four related blocks, B0-4 to B0-7. See also FIG. 4A. The blocks can be in one or more planes. The row decoder 124 of FIG. 1A provides voltages to word lines and select gate control lines of each block via pass transistors 322. In one approach, a separate row decoder is provided for each block. The row decoders can be provided at one side of a block, as in FIG. 6A, or at opposing ends of the block. A row decoder can also be shared by two block, one in each of two planes such as P0 and P1 in FIG. 4A.

The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B0-4 to B0-7, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected data word line (WL) driver 347, which provides a voltage on a data word line selected during a program or read operation. The driver 347 can provide a pre-charge voltage and a program voltage on WLn during a program loop of a program operation. A driver 348 can be used for unselected data word lines. Dummy word line drivers can also be provided if dummy word lines are used.

The voltage drivers can also include separate SGD drivers for each sub-block. For example, SGD drivers 346, 346a, 346b and 346c can be provided for SB0, SB1, SB2 and SB3, respectively, such as in FIG. 5A. The SGD drivers provide a voltage to a control line connected to the control gates of an SGD transistor (drain-side select gate transistor). In one option, an SGS driver 345 is common to the different sub-blocks in a block, and provides a voltage to a control line connected to the control gates of the SGS transistors (source-side select gate transistors).

The various components, including the row decoder, may receive commands from a controller such as the state machine 112 or the controller 122 to perform the functions described herein.

The substrate (e.g., p-well) voltage driver 330 provides a voltage Vsub to the substrate. The source region voltage drivers 331a, 331b and 331c provide voltage signals to the three source regions, SRC1, SRC2 and SRC3, respectively, in the substrate.

Bit line voltage drivers 340 include voltage sources which provide voltages to a set of bit lines 342. The set of bit lines can be shared by multiple blocks.

In a stacked memory device such as depicted in FIG. 4A to 6, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4A:
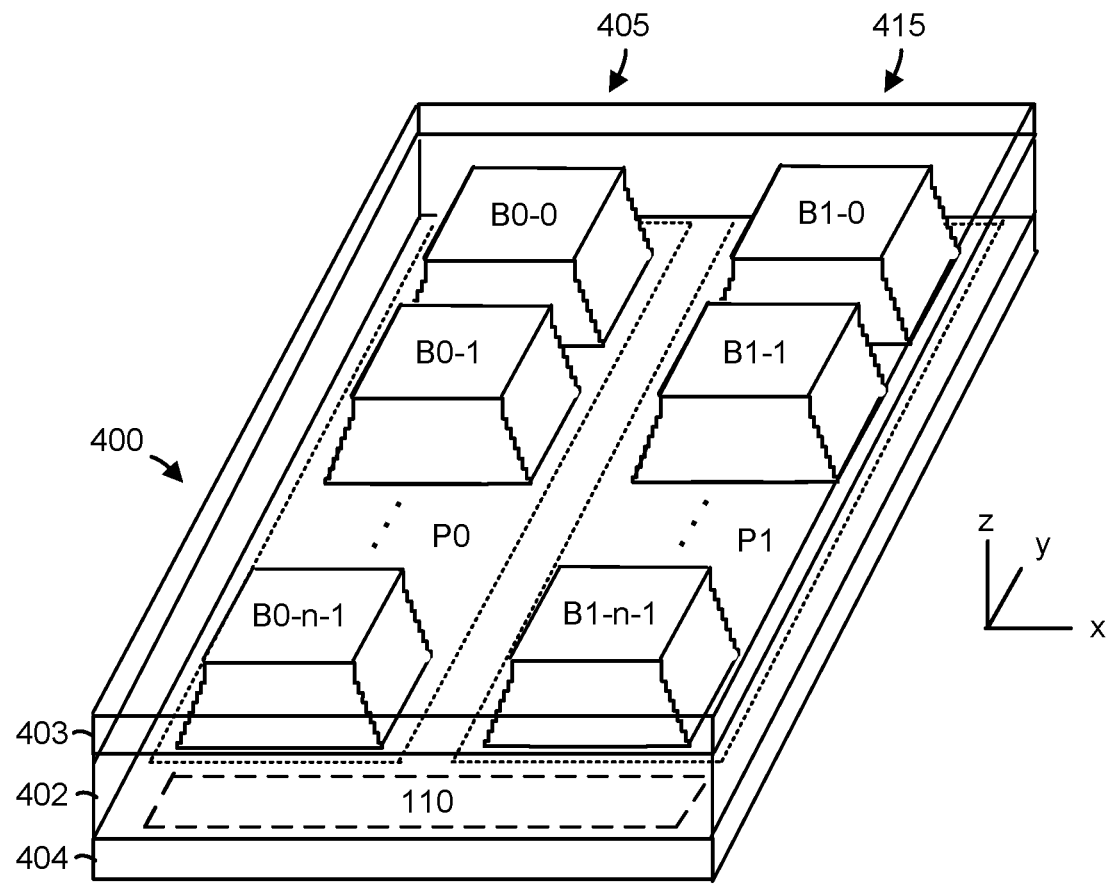
FIG. 4A is a perspective view of an example memory die 400 in which blocks are provided in respective planes P0 and P1, consistent with FIG. 1A.

FIG. 4A is a perspective view of an example memory die 400 in which a plurality of blocks are provided in respective planes P0 and P1, consistent with FIG. 1A. The memory die includes a substrate 404, an intermediate region 402 in which blocks of memory cells are formed, and an upper region 403 in which one or more upper metal layers are patterned such as to form bit lines and other conductive paths. Planes P0 and P1 represent respective isolation regions which are formed in the substrate 404. Further, a first block sequence 405 of a number n blocks, labelled B0-0 to B0-$n$-1, are formed in P0, and a second block sequence 415 of a number n blocks, labelled B1-0 to B1-$n$-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erase concurrently.

The substrate 404 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

While the above example is directed to a 3D memory device with vertically extending NAND strings, the techniques provided herein are also applicable to a 2D memory device in which the NAND strings extend horizontally on a substrate.

Figure 4B:
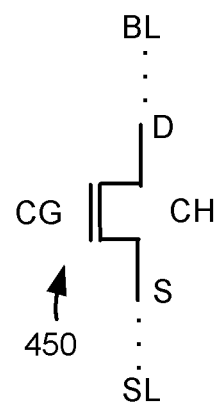
FIG. 4B depicts an example transistor 450 in the memory structure 126 of FIG. 1A.

FIG. 4B depicts an example transistor 450 in the memory structure 126 of FIG. 1A. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string. The transistor can represent a memory cell or a select gate transistor, for example.

Figure 5A:
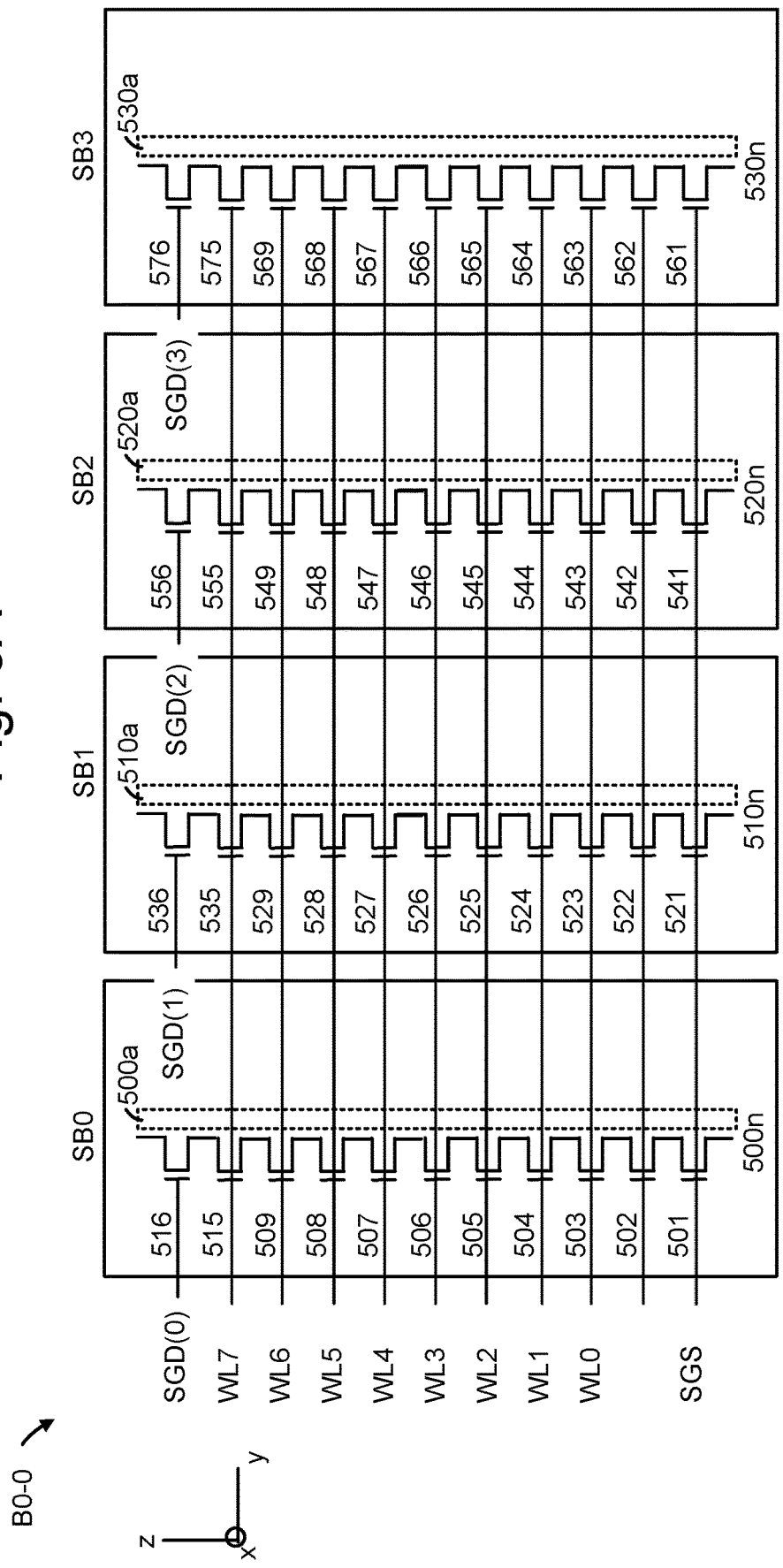
FIG. 5A depicts an example view of NAND strings in the block B0-0 of FIG. 4A.

FIG. 5A depicts an example view of NAND strings in the block B0-0 of FIG. 4A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 500n, 510n, 520n and 530n, respectively. The NAND strings have data word lines, dummy word lines and select gate lines. Each sub-block comprises a set of NAND strings which extend in the x direction and which have a common SGD line or control gate layer. The NAND strings 500n, 510n, 520n and 530n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line, and end at WL7, the drain end word line, for example. This example includes eight data word lines for simplicity. In practice, many more word lines are used, such as 64, 96 or more word lines.

In an erase operation, typically the entire block is erased, although a partial block erase is also possible such as by erasing a selected sub-block of the block and/or by erasing memory cells connected to a subset of the word lines which is fewer than all of the word lines.

The plurality of memory cells of B0-0 are arranged in NAND strings, where each NAND string comprising a continuous charge trapping layer along a length of the NAND string. The NAND strings 500n, 510n, 520n and 530n have channels 500a, 510a, 520a and 530a, respectively. Additionally, NAND string 500n includes SGS transistor 501, dummy memory cell 502, data memory cells 503-514, dummy memory cell 515 and SGD transistor 516. NAND string 510n includes SGS transistor 521, dummy memory cell 522, data memory cells 523-534, dummy memory cell 535 and SGD transistor 536. NAND string 520n includes SGS transistor 541, dummy memory cell 542, data memory cells 543-554, dummy memory cell 555 and SGD transistor 556. NAND string 530n includes SGS transistor 561, dummy memory cell 562, data memory cells 563-574, dummy memory cell 575 and SGD transistor 576.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 5B:
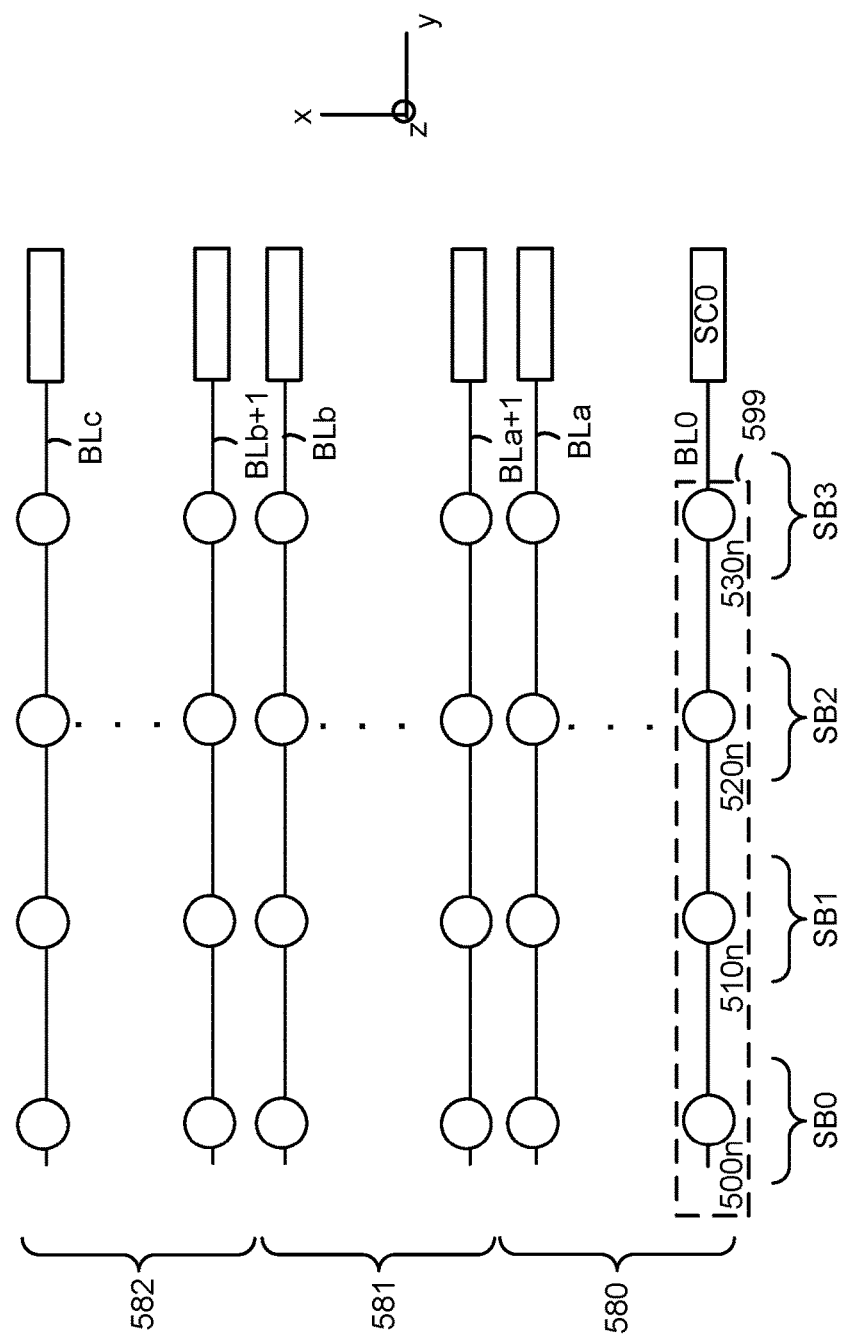
FIG. 5B depicts an example top view of the block B0-0 of FIG. 5A, with respective NAND strings, bit lines and sense circuits.

FIG. 5B depicts an example top view of the block B0-0 of FIG. 5A, with respective NAND strings, bit lines and sense circuits. The view is in the x-y plane. Each circle represents a NAND string. In this example, the block is divided into three subsets 580-582 corresponding to three separate source regions SRC1-SRC3, respectively, consistent with FIG. 6A. The first subset 580 comprises bit lines BL0 to BLa and the associated NAND strings and sense circuits. The second subset 581 comprises bit lines BLa+1 to BLb and the associated NAND strings and sense circuits. The third subset 582 comprises bit lines BLb+1 to BLc and the associated NAND strings and sense circuits. Each subset represents a subset of NAND strings in the block which is in contact with a respective source region. The different subsets of NAND strings are in contact with the different source regions SRC1-SRC3, respectively. Also, the different subsets of the set of NAND strings are in contact with different subsets of the set of bit lines, e.g., BLa+1 to BLb, BLa+1 to BLb and BLb+1 to BLc.

Further, the block is divided into sub-blocks SB0-SB3 consistent with FIG. 5A. SB0 includes the NAND string 500n of FIG. 5A and additional NAND strings. SB1 includes the NAND string 510n of FIG. 5A and additional NAND strings. SB2 includes the NAND string 520n of FIG. 5A and additional NAND strings. SB3 includes the NAND string 530n of FIG. 5A and additional NAND strings.

Each bit line is connected to a respective set of NAND strings, including one NAND string in each sub-block. For example, BL0 is connected to NAND strings 500n, 510n, 520n and 530n in a set of NAND strings 599. Each bit line is also connected to a respective sense circuit, consistent with the sense circuits 60-63 of FIG. 2. For example, BL0 is connected to a sense circuit SC0.

A program operation, which include verify tests, can occur for one sub-block at a time, in one approach. In the program operation, a program pulse is applied to a selected word line. A verify test is then performed for memory cells connected to the selected word line in a selected sub-block. Separate verify tests can be performed for each programmed data state. See example verify voltages in FIG. 18. During the verify test, a verify voltage is applied to the memory cells while a sense circuit senses a current on the respective bit lines. For example, SC0 can sense a current on BL0 based on a current in any of the NAND strings 500n, 510n, 520n and 530n. The selected sub-block passes the verify test if the current is below a specified level for all, or nearly all, of the selected NAND strings in the sub-block. For example, the verify test may be passed if no more than 1-5% of the NAND strings in the sub-bock fail the verify test. When the current is below a specified level for a NAND string, this means the threshold voltage of the selected memory cell in the NAND string is above the verify voltage.

Figure 5C:
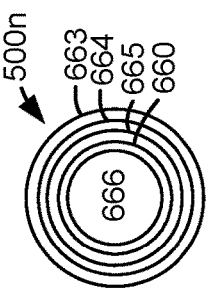
FIG. 5C depicts a cross-sectional view of the NAND string 700n of FIGS. 5A and 5B.

FIG. 5C depicts a cross-sectional view of the NAND string 500n of FIGS. 5A and 5B. The NAND strings are formed by etching memory holes in a stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide such as aluminum oxide) and a channel 660 (e.g., comprising polysilicon). A dielectric core 666 (e.g., comprising silicon dioxide) can also be provided. The layers may provide a MANOS or metal (W)-aluminum oxide (Al2O3)-nitride (Si3N4)-oxide (SiO2)-silicon (Si) structure. A word line or control line can comprise a metal such as Tungsten. In this example, all of the layers are provided in the memory hole. In other approaches, some of the layers can be provided in the word line or control line layer. The multiple thin layers form a columnar active area of a NAND string.

FIG. 6A depicts an example configuration of the block B0-0 of FIG. 4A, showing separate source regions SRC1, SRC2 and SRC3 in the substrate 404. As mentioned at the outset, the performance of a block can be improved by providing separate source regions in the substrate with separate voltage drivers. In this example, three source regions SRC1-SRC3 are provided in the substrate 404. The different source regions can be of the same size or different sizes in terms of the associated number of NAND strings and/or bit lines. Generally, the performance of a block can be improved by providing two or more source regions.

Insulating regions 604 and 605 in the substrate separate the source regions. Each insulating region formed in the substrate is between adjacent source regions of a plurality of separate source regions. For example, the insulating region 604 is between SRC1 and SRC2, and the insulating region 605 is between SRC2 and SRC3.

The block comprises a stack region 601 in which the NAND strings are formed. The region 601 is bounded by trenches 602 and 603 at opposite edges of the block. The trenches can be formed to allow the removal of sacrificial layers of the block, as discussed further below. The trenches can then be filled with insulating material only, or with insulating and conductive materials. The use of a conductive material in the trenches can provide an electrical contact to the source regions, as described further below. Generally, one or more trenches can be provided in a block, at the edge of the block or another location within the block.

Insulating materials 606-608 can be provided in shallow trenches which are etched at the top of the block. The insulating materials can separate one or more select gate layers at the top of the block to form the different sub-blocks of the block. This example includes sub-blocks SB0-SB3, consistent with FIG. 5A. The one or more select gate layers of each sub-block are connected to a respective voltage driver.

The region 601 of the block includes different portions B0-0a, B0-0b and B0-0c corresponding to the different source regions SRC1-SRC3, respectively. The NAND strings in each portion are connected at their source ends to the corresponding source region.

The bit lines BL0 to BLa, BLa+1 to BLb and BLb+1 to BLc, consistent with FIG. 5B, are connected to the drain ends of the NAND strings in the block portions B0-0a, B0-0b and B0-0c, respectively. The bit lines extend in a y direction, perpendicular to the trenches 602 and 603 and the insulating materials 606-608, which extend in the x direction. The bit lines extend parallel to the insulating regions 604 and 605.

The word line drivers 347 and 348 of FIG. 3 are connected to word lines in the region 601, e.g., at one end 620 of the block. An axis 610 depicts a distance from the word line drivers to different NAND strings in the block, including a close distance D0 and a far distance D3. In this example, the block region B0-0c extends from D0-D1 and is the closest block region to the word line drivers. The block region B0-0b extends from D1-D2 and is the second closest block region to the word line drivers. The block region B0-0a extends from D2-D3 and is the farthest block region from the word line drivers.

The width of the block is bw and the length along the long side of the block is D3-D0.

Figure 6B:
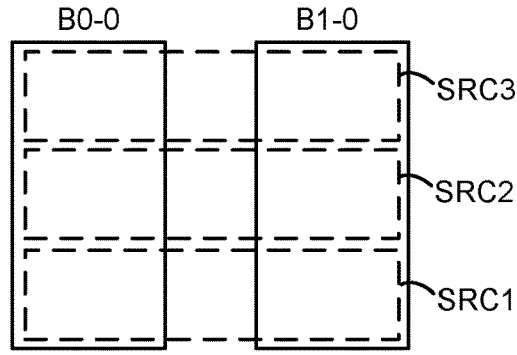
FIG. 6B depicts an example configuration of the blocks B0-0 and B1-0 of FIG. 4A, showing separate source regions SRC1, SRC2 and SRC3.

FIG. 6B depicts an example configuration of the blocks B0-0 and B1-0 of FIG. 4A, showing separate source regions SRC1, SRC2 and SRC3. Each source region can extend under one or more blocks, where each block is in a separate plane, for example. In this example, each of the source regions SRC1-SRC3 extends under B0-0 in P0 and under B1-0 in P1. This approach can facilitate the fabrication process since the number of separate source regions on a substrate is less than if a separate source region was provided for each block. In this case, each source region comprises a diffusion region in the substrate extending the width (in the y direction) of multiple blocks, and at least a width of one block.

Figure 7A:
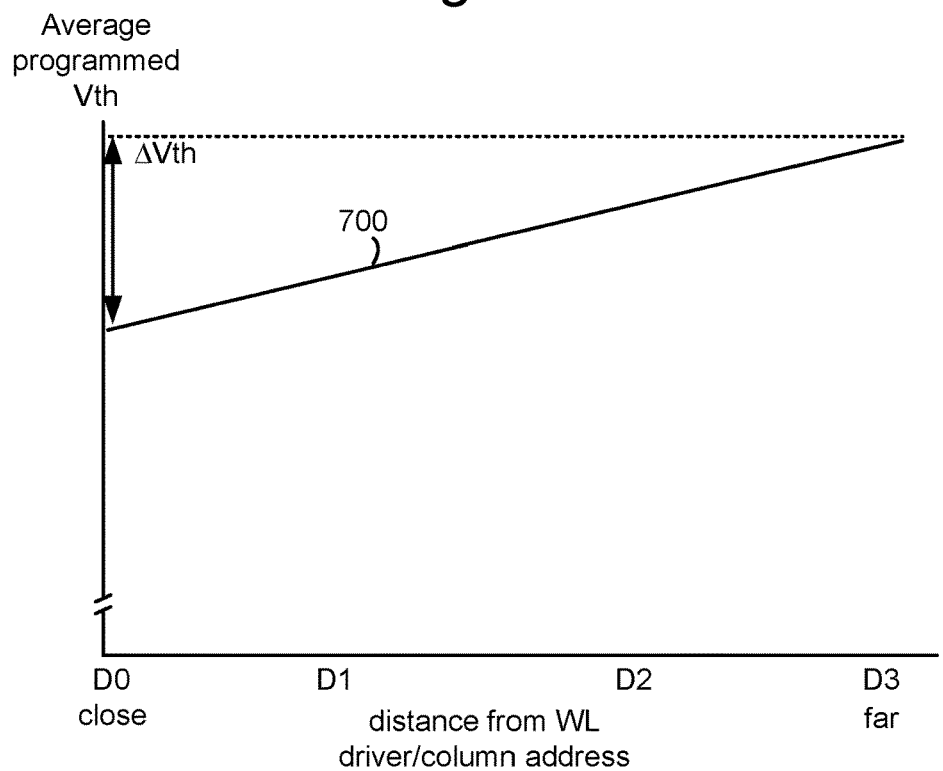
FIG. 7A depicts a plot of an average programmed threshold voltage (Vth) versus a distance from a word line (WL) driver for NAND strings in the block of FIG. 6A.

FIG. 7A depicts a plot of an average programmed threshold voltage (Vth) versus a distance from a word line (WL) driver for NAND strings in the block of FIG. 6A. The distance corresponds to a column address of the NAND strings. The NAND strings can be arranged in columns or groups such as groups of 16 NAND strings. To obtain this data, the memory cells were programmed using a fixed number of program pulses. The Vth varies since the RC time constant of the word line voltage signal varies based on the distance from the WL driver. In particular, the plot 700 indicates NAND strings closer to the WL driver have a lower RC time constant and a faster programming speed and therefore reach a higher Vth in response to the fixed number of program pulses. ΔVth denotes the Vth deficit, which is the difference in Vth for memory cells furthest from the WL driver compared to memory cells closest to the WL driver. A Vth deficit of over 0.3 V has been observed. Variations can also exist for different memory chips fabricated from the same wafer.

Figure 7B:
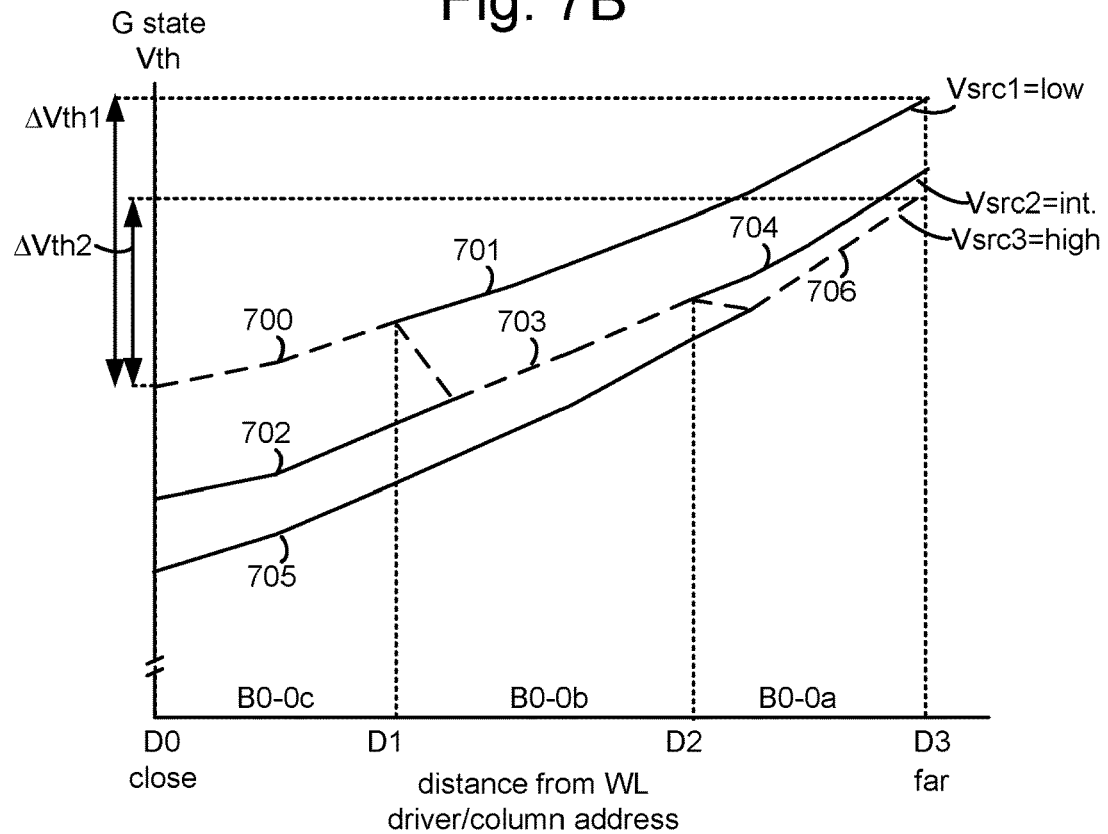
FIG. 7B depicts plots of threshold voltage (Vth) versus a distance from a word line (WL) driver for NAND strings in the block of FIG. 6A, showing the effects of different voltages at the source regions SRC1-SRC3 in a verify operation for G state memory cells.

FIG. 7B depicts plots of threshold voltage (Vth) versus a distance from a word line (WL) driver for NAND strings in the block of FIG. 6A, showing the effects of different voltages at the source regions SRC1-SRC3 in a verify operation for G state memory cells. The vertical axis depicts a Vth of the G state memory cells in an example where the G state is the highest data state, consistent with FIG. 17. Plots 700 and 701 represent the Vth when the source voltage, Vsrc1, is relatively low. Plots 705 and 706 represent the Vth when the source voltage, Vsrc3, is relatively high. Plots 702-704 represent the Vth when the source voltage, Vsrc2, is at an intermediate level.

The current in a NAND string during a sensing operation such as a verify test or read operation is a function of the bit line voltage at the drain end of the NAND string and the source region voltage at the source end of the NAND string. The Vth of a particular memory cell being read depends on a difference between the voltage applied at the control gate of the cell (applied via a respective word line) and the source region voltage. The control gate resistance will be relatively high for a particular memory cell in a region of a block which is relatively far from the WL driver. As a result, the Vth of the particular memory cell will appear to be higher compared to a memory cell which is closer to the WL driver, for a given source region voltage.

For example, consider a memory cell close to the WL driver and a memory cell far from the WL driver, where both memory cells store the same amount of charge. Assume VrB (FIG. 17) is output by the WL driver in a read operation, so that the close memory cell receives VrB and the far memory cell receives VrB−0.2 V. In this case, the close memory cell might be sensed as being in a conductive state (e.g., as an A state cell) because the local WL voltage exceeds the cell's Vth, while the far memory cell might be sensed as being in a non-conductive state (e.g., as a B state cell) because the local WL voltage does not exceed the cell's Vth. This results in a read error.

A solution which allows reading a consistent cell Vth along a word line at different distances from the WL driver is to calibrate up the source region voltage for different regions of the block as the distance from the WL driver increases. That is, the source region voltage can be an increasing function of the distance from the WL driver, e.g., the source region voltage can be greater when the distance from the WL driver is greater. With this approach, there is a decrease in the gate-to-source voltage and the Vth for the far memory cell so that the local WL voltage exceeds the cell's Vth, in the above example involving VrB. The far memory cell will therefore be sensed as being in a conductive state (e.g., as an A state cell), the same as the close memory cell.

This solution is demonstrated by selecting source region voltages depicted by the dashed line plots, including plots 700, 703 and 706 for the block regions B0-0a, B0-0b and B0-0c, respectively. The voltages associated with the plots 700, 703 and 706 are Vsrc=low, Vsrc=int. and Vsrc=high, respectively. Example values are 1.5 V, 1 V and 0.5 V, respectively. This approach reduces the variation in the Vth from $\Delta Vth1$ to $\Delta Vth2$. With a reduced variation in Vth, the Vth distributions of the memory cells across the block are narrower and read errors are reduced.

In one possible implementation, during a sensing operation for memory cells associated with one of the source regions, a control circuit is configured to instruct a respective source region voltage driver to set a voltage of the respective voltage signal as a function of the distance of the one of the memory cells from the word line driver. In other words, the voltage can be set as a function of the distance of the one of the source regions from the word line driver, or as a function of the position of the one of the source regions among the separate source regions.

The ability to control the voltages of the separate source regions can also be helpful in situations such as sensing a memory cell with a negative threshold voltage. The voltages of the separate source regions could be optimized based on other factors such as the selected word line position in the block.

The source voltages can be set based on any desired criterion. Setting the source voltage based on a distance from a WL driver is just one example.

Figure 8A:
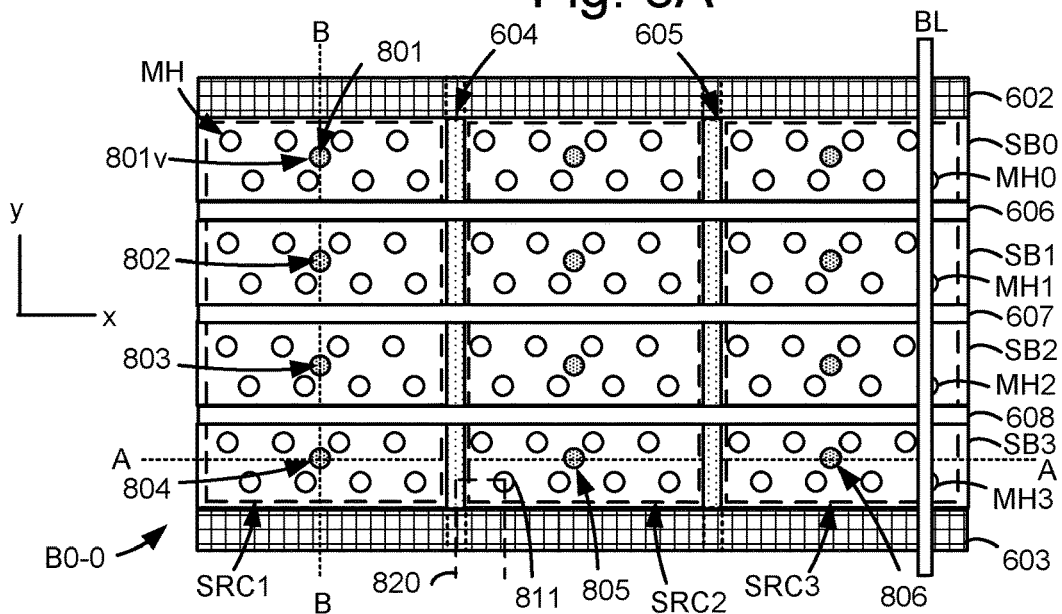
FIG. 8A depicts a top view of the block of FIG. 6A, in an Example I(A) in which post-shaped contacts to the source regions are within the block.

FIG. 8A depicts a top view of the block of FIG. 6A, in an Example I(A) in which post-shaped contacts to the source regions are within the block. Generally, one or more conductive paths or contacts can be provided between a source region in the substrate and a metal layer above the stack, such as in the upper region 403 depicted in FIG. 4A. In this example, the conductive paths comprise multiple post-shaped contacts for each of the source regions SRC1-SRC3. For example, post-shaped contacts 801-804 are provided for SRC1 in SB0-SB3, respectively. The post-shaped contact 801 is in a post-shaped void 801v such as a cylindrical hole. Similar post-shaped contacts are provided for SRC2 and SRC3, including the post-shaped contacts 805 and 806, respectively, in SB3. The post-shaped contacts, depicted as shaded circles, can be provided at various locations above the source region, between the memory holes (MH), depicted as open circles. In this simplified example, there are 32 NAND strings connected to each source region. Further, there are 24 NAND strings in each sub-block, with eight NAND strings per source region.

A larger number of contacts reduces resistance but takes up room in the block. This example provides one contact per source region in each sub-block, but other options are possible.

In this example, the trenches 602 and 603 at the opposite edges of the block comprise insulation and are not used as contacts to the source regions.

The insulating regions 604 and 605 in the substrate which separate the source regions are also depicted. The insulating regions are below word line layers in the block but are depicted for illustration purposes. A single bit line BL is depicted to show the bit line direction. The bit line is connected to one NAND string/memory hole in each sub-block, e.g., to MH0-MH3 in SB0-SB3, respectively.

Cross-sectional views of a portion of the block along a path 820 are discussed further below. The path 820 extends across the trench 603 to a memory hole 811, then to the insulating region 604, and then back across the trench 603.

Each source region can comprise a diffusion region in the substrate which extends a width (bw) of the block, e.g., in the bit line direction (y direction).

Figure 8B:
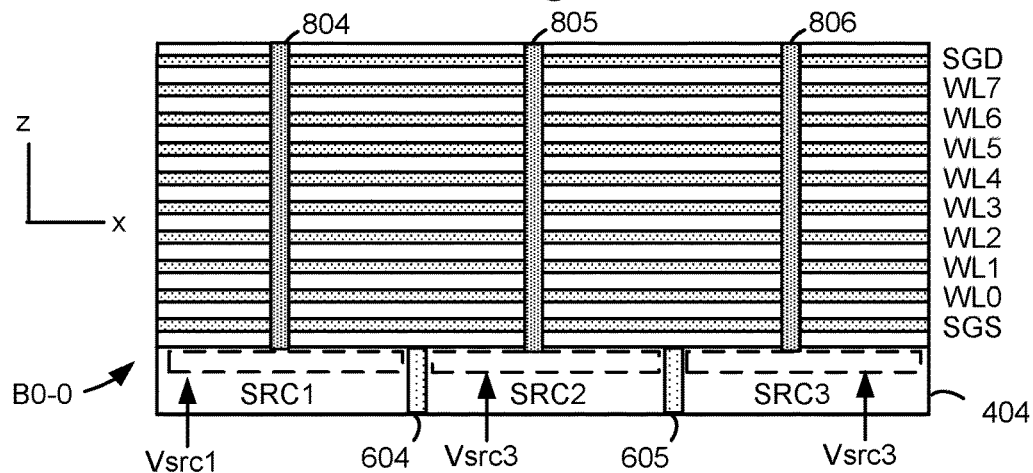
FIG. 8B depicts a cross-sectional view of the block of FIG. 8A along the line A-A.

FIG. 8B depicts a cross-sectional view of the block of FIG. 8A along the line A-A. The block has eight word line layers, one SGS layer and one SGD layer, consistent with FIG. 5A, as a simplified example. The post-shaped contacts 804-806 in SB3 are depicted as upright cylinders which extend from a respective source region SRC1-SRC3 in the substrate 404, at the bottom of the stack, to the top of the stack or above the top of the stack, as in FIG. 8C. Each source region SRC1-SRC3 receives a respective voltage Vsrc1-Vsrc3 via the respective contacts 804-806, for instance.

Figure 8C:
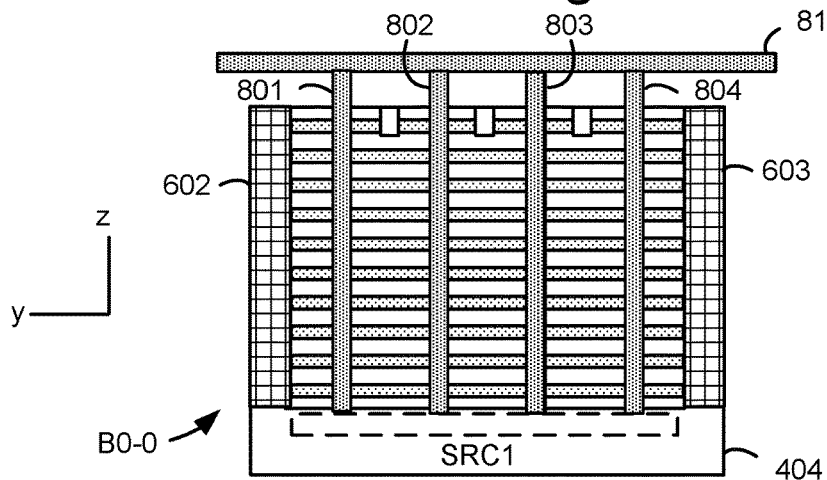
FIG. 8C depicts a cross-sectional view of the block of FIG. 8A along the line B-B.

FIG. 8C depicts a cross-sectional view of the block of FIG. 8A along the line B-B. This view shows the post-shaped contacts 801-804 extending above the stack to a horizontally extending conductive path 810 (not shown in FIG. 8A or 8B). A different horizontally extending conductive path can be provided for each source region to carry a different voltage signal.

Figure 9A:
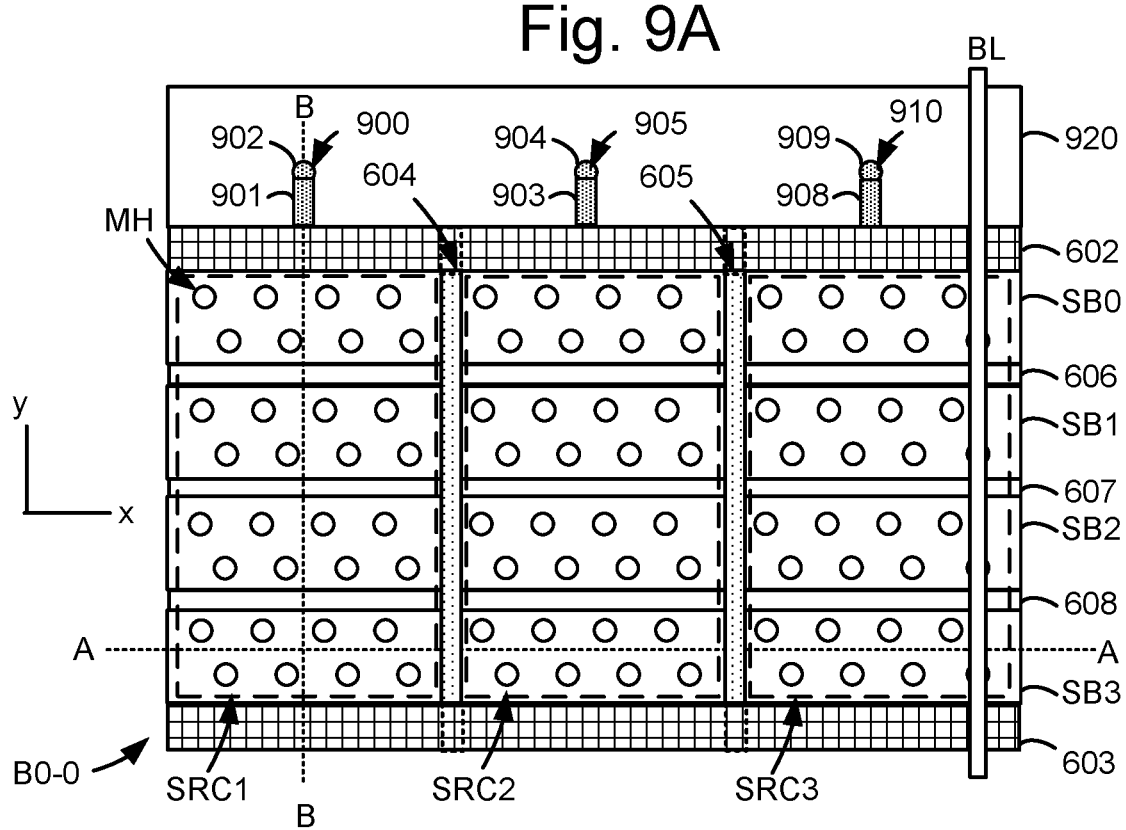
FIG. 9A depicts a top view of the block of FIG. 6A, in an Example I(B) in which post-shaped contacts to the source regions are outside the block.

FIG. 9A depicts a top view of the block of FIG. 6A, in an Example I(B) in which post-shaped contacts to the source regions are outside the block. L-shaped contacts 900, 905 and 910 are connected to SRC1, SRC2 and SRC3, respectively, to provide respective voltage signals to the source regions. Each L-shaped contact comprises a post-shaped contact in a lateral region 920 of the block B0-0 and a horizontally-extending portion at the bottom of the post-shaped portion. For example, the L-shaped contacts 900, 905 and 910 include post-shaped contacts 902, 904 and 909, respectively, and horizontally-extending portions 901, 903 and 908, respectively.

Figure 9B:
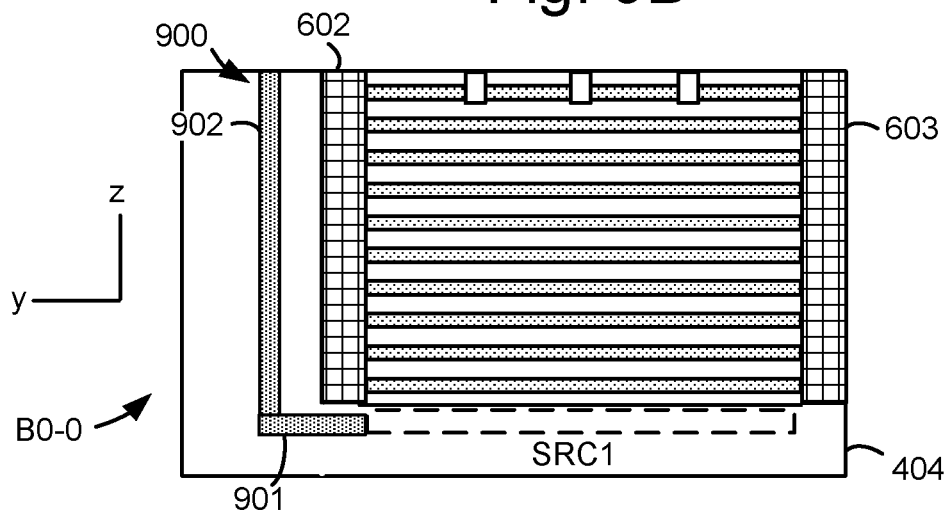
FIG. 9B depicts a cross-sectional view of the block of FIG. 9A along the line B-B.

FIG. 9B depicts a cross-sectional view of the block of FIG. 9A along the line B-B. This view shows the L-shaped contact 900 which includes the post-shaped contact 902 and the horizontally-extending portion 901, which is connected to SRC1. An advantage of this approach is that the area of the block used for the memory holes is not taken up by the post-shaped contacts. Although, additional processing is involved for the horizontally-extending portions. In particular, trenches can be formed in the substrate and filled with a conductive material to provide the horizontally-extending portions. Subsequently, a hole is etched in the stack and filled with a conductive material to provide the post-shaped contacts.

Figure 10:
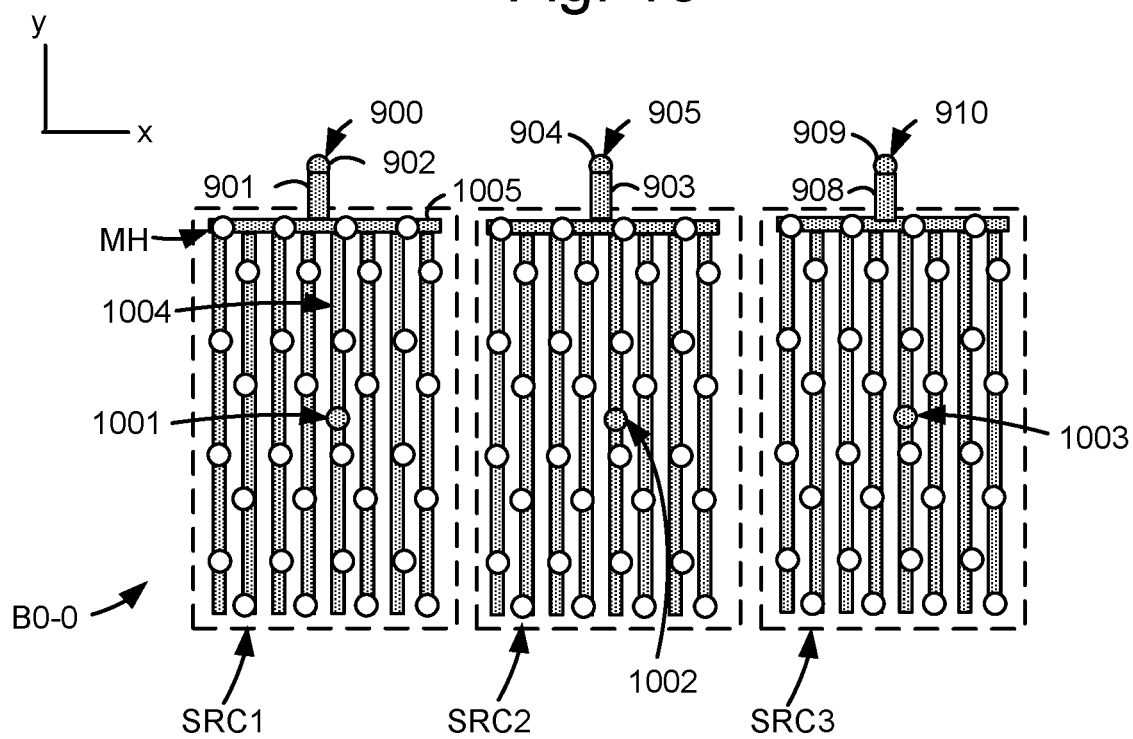
FIG. 10 depicts a top view of the block of FIG. 6A, in an Example I(C) in which contacts to the source regions are within the block and outside the block, and the source region comprises distinct source lines.

FIG. 10 depicts a top view of the block of FIG. 6A, in an Example I(C) in which contacts to the source regions are within the block and outside the block, and the source region comprises distinct source lines. The L-shaped contacts 900, 905 and 910 of FIG. 9A are repeated. Post-shaped contacts 1001-1003 are also provided for SRC1-SRC3, respectively. This approach provides a single post-shaped contact within the block for each source region, but multiple post-shaped contacts can be provided for each source region. Each source region comprises multiple parallel rows connected at one end. For example, SRC1 includes an example row 1004 and a connecting part 1005.

Trenches can be formed in the substrate and filled with a conductive material such as metal to provide the parallel rows and the connecting part. The contacts can be provided outside and/or within the block.

Figure 11A:
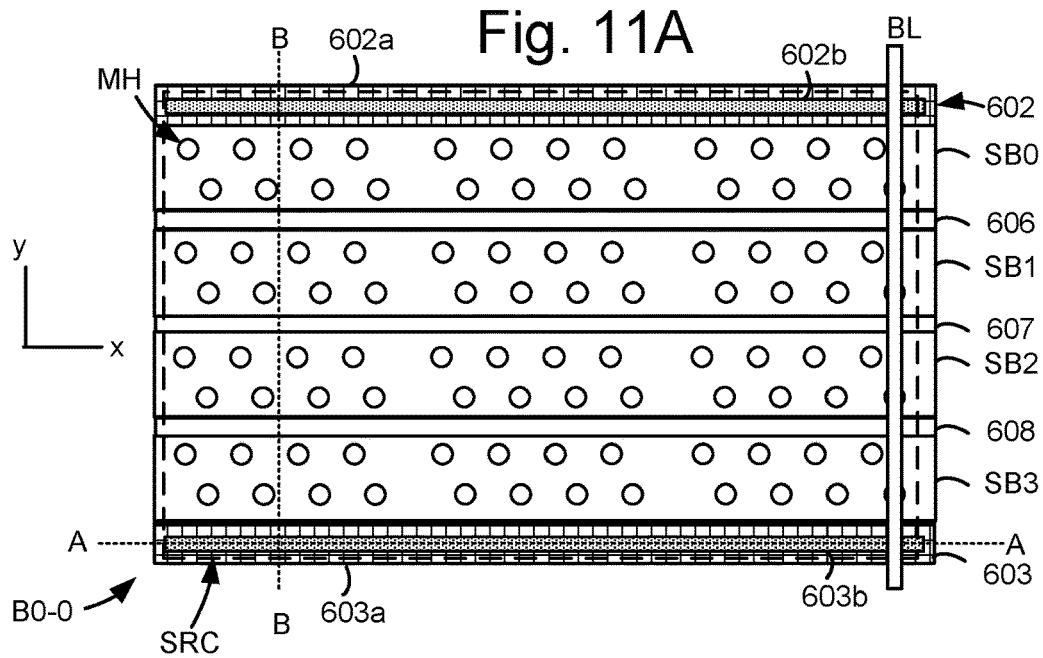
FIG. 11A depicts a top view of a block having a single source region, SRC, where contacts to the source region comprise planar contacts at the edges of the block.

FIG. 11A depicts a top view of a block having a single source region, SRC, where contacts to the source region comprise planar contacts at the edges of the block. A planar contact can have generally flat opposing walls which extend vertically upward from the substrate in the x-z plane. A planar contact can have a generally rectangular cross-section, as shown in FIG. 11C. A planar contact can be a continuous wall-shaped contact. In particular, the trench 602 includes a planar contact 602*b* and an insulating material 602*a*, and the trench 603 includes a planar contact 603*b* and an insulating material 603*a*. Each of the two planar contacts touches the source region SRC to carry a common voltage signal to SRC. The planar contacts comprise a conductive material such as metal.

Figure 11B:
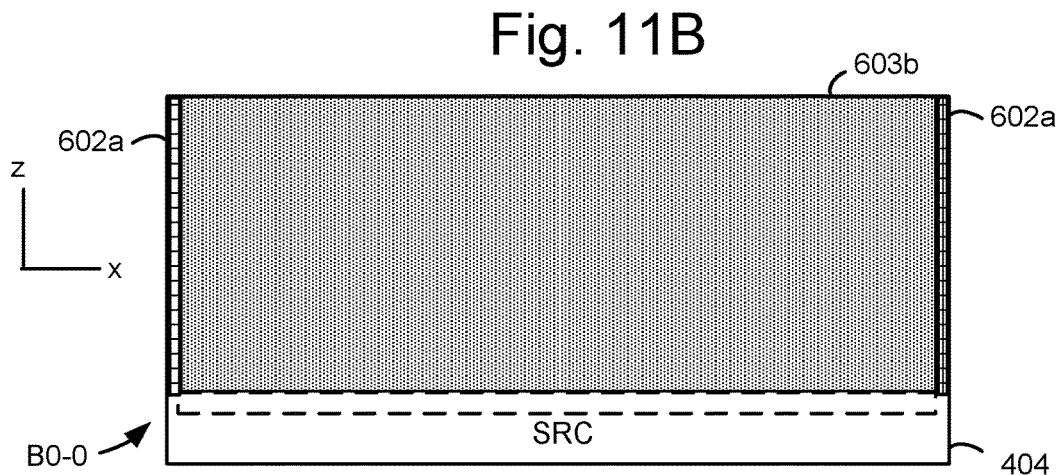
FIG. 11B depicts a cross-sectional view of the block of FIG. 11A along the line A-A.
Figure 11C:
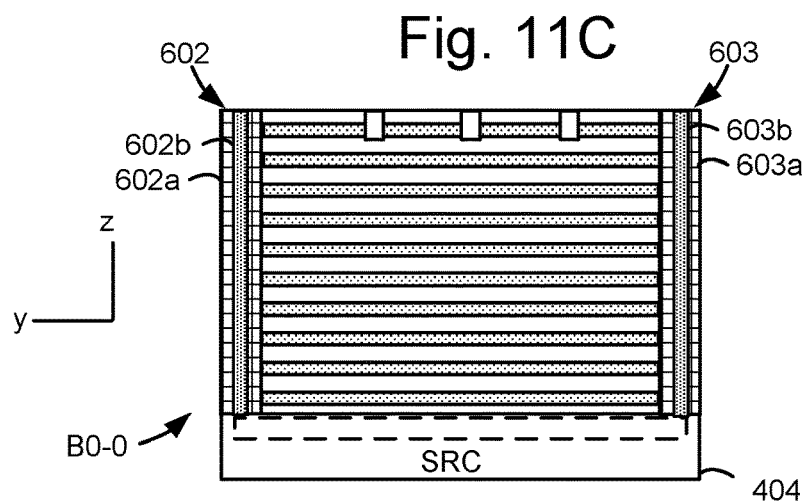
FIG. 11C depicts a cross-sectional view of the block of FIG. 11A along the line B-B.

FIG. 11B depicts a cross-sectional view of the block of FIG. 11A along the line A-A. The planar contact 603*b* extends the length of the block in the x direction, and the height of the block in the z direction. Since a single planar contact 603*b* extends the length of the block, it cannot be used to provide different voltage signals to different source regions in the substrate. Techniques described further below modify this configuration to provide separate planar contacts for different source regions.

FIG. 11C depicts a cross-sectional view of the block of FIG. 11A along the line B-B. The planar contacts 602*b* and 603*b* extend the height of the block and are surrounded on their sides by the insulating materials 602*a* and 603*a*, respectively.

Figure 12A:
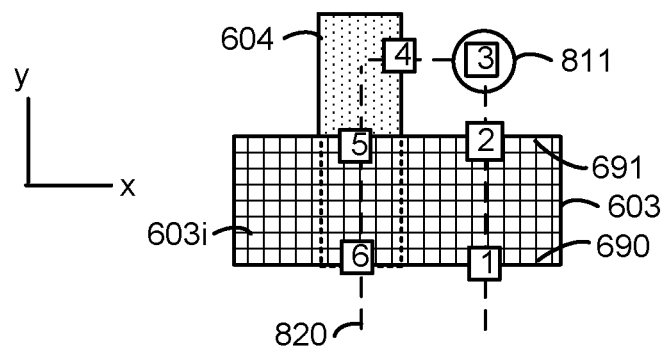
FIG. 12A depicts a detail of a region of the block of FIG. 8A along the path 820, consistent with Examples I(A)-I(C).

FIG. 12A depicts a detail of a region of the block of FIG. 8A along the path 820, consistent with Examples I(A)-I(C). Locations "1" to "6" are identified along the path. The path 820 extends across the trench 603 (from an outer wall 690 of the trench at the location "1" to an inner wall 691 of the trench at location "2"), to the memory hole 811 (location "3"), to an edge of the insulating region 604 (location "4"), through the middle of the insulation region 604 to the inner wall of the trench 603 (location "5") and to the outer wall of the trench 603 (location "6"). The trench 603 is filled with an insulating material 603*i*.

Figure 12B:
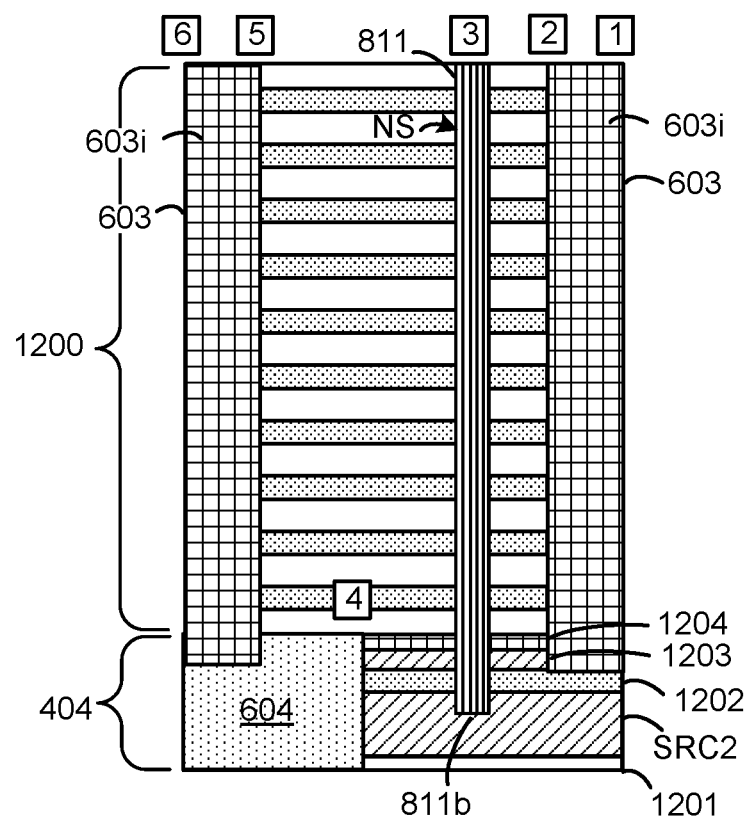
FIG. 12B depicts a cross-sectional view of the block region of FIG. 12A along the path 820.

FIG. 12B depicts a cross-sectional view of the block region of FIG. 12A along the path 820. The block comprises a stack 1200 formed on a substrate 404. The stack comprises conductive layers, shown as shaded rectangles (used as word lines and select gate lines) separated by dielectric layers, shown as open rectangles. The trench 603, filled with insulation 603*i*, and the memory hole 811, filled with layers and a dielectric core (consistent with FIG. 5C). The insulating region 604 is formed in a portion of the substrate from locations "4" to "6." A remaining portion of the substrate includes a metal layer 1201 to reduce the resistance of the source region SRC2. SRC2 may comprise a doped polysilicon region such as an n-type polysilicon, an insulating layer 1202 such as SiN, an n-type polysilicon cover layer 1203 and an insulating layer 1204 such as an oxide, e.g., SiO. The n-type polysilicon may comprise polysilicon doped with Phosphorus or Arsenic, for example.

The materials in the memory hole form a NAND string NS, where the bottom 811*b* or source end of the NAND string is in contact with SRC1.

The insulating region 604 extends in the substrate to isolate the SRC2 region from the SRC1 region (FIG. 8A). The trench 603 is filled with an insulating material 603*i*, as discussed.

FIG. 12C to 12I describe a sequence for fabricating the block region of 12B. The locations "1" to "6" along the path 820 are consistent with FIGS. 12A and 12B.

FIG. 12C depicts an initial configuration of a block region consistent with FIG. 12B, where the substrate 404 is formed. Note that an additional portion of the substrate extends further below the substrate 404 which is shown. The substrate comprise the metal layer 1201, and the SRC2 region on the metal layer. Above the SRC2 layer is a sacrificial polysilicon layer, 1202*b* such as a p-type polysilicon, between oxide (e.g., SiO) layers 1202*a* and 1202*c*. The p-type polysilicon may comprise polysilicon doped with Boron or Gallium, for example.

FIG. 12D depicts a configuration of a block region which follows the configuration of FIG. 12C, where an insulation region is formed in the substrate. The insulating region 604 is formed by etching a trench in the substrate in the y-direction of FIG. 8A, and filling the trench with an insulating material. The insulating region 604 can extend from a height which is below the bottom of the SRC2 region to a height which is above the top of the SRC2 region to electrically isolate SRC2 from SRC1.

FIG. 12E depicts a configuration of a block region which follows the configuration of FIG. 12D, where a stack of layers is formed on the substrate. The stack 1200 is formed by depositing layers above the substrate. The layers can comprising layers of a dielectric such as an oxide alternating with layers of a sacrificial material ("s") such as SiN.

FIG. 12F depicts a configuration of a block region which follows the configuration of FIG. 12E, where a memory hole 811 and NAND string NS are formed in the stack. The memory holes are etched through the layers in the stack. Various layers and a dielectric core are then deposited in the memory holes to form NAND strings (FIG. 5C).

FIG. 12G depicts a configuration of a block region which follows the configuration of FIG. 12F, where a trench 1220 is formed in the stack, such as by etching through the stack in the x-direction (FIG. 8A). The portion of the trench between the locations "1" and "2" extends down to the sacrificial polysilicon layer 1202*b*. The portion of the void between the locations "5" and "6" extends down to the insulating region 604. The trench can have a uniform depth. Once the trench is formed, the sacrificial layers ("s") can be removed by suppling an etchant in the voids. A metal such as Tungsten can then be supplied in the voids to form conductive layers in the stack, as depicted by FIG. 12H.

FIG. 12H depicts a configuration of a block region which follows the configuration of FIG. 12G, where a metal is deposited in the layers of the stack via the trench. Conductive layers, shown as shaded rectangles, are formed when the metal fills the voids created when the sacrificial layers are removed. A metal layer is also formed in the trench as a byproduct.

FIG. 12I depicts a configuration of a block region which follows the configuration of FIG. 12H, where the metal is removed from the trench 1220 such as by etching. The configuration of FIG. 12B follows the configuration of FIG. 12I by depositing insulation in the trench 1220.

FIG. 13A depicts a top view of the block of FIG. 6A, in an Example II in which different planar contacts to the source regions are provided at the edges of the block. Note that the planar contacts are at the edges of the block in this example, but could be at other locations, including in the interior of the block. For example, the trench 602 comprises planar contacts 602b1-602b3 to SRC1-SRC3, respectively, and the trench 603 comprises planar contacts 603b1-603b3 to SRC1-SRC3, respectively. Adjacent planar contacts are separated (electrically isolated) from one another by an insulating structure such as a post. For example, the planar contacts 602b1 and 602b2 are separated from one another by an insulating post 1300, and the planar contacts 602b2 and 602b3 are separated from one another by an insulating post 1301. Similarly, the planar contacts 603b1 and 603b2 are separated from one another by an insulating post 1302, and the planar contacts 603b2 and 603b3 are separated from one another by an insulating post 1303. The posts 1300 and 1302 can be aligned with and contact the insulating region 604, and the posts 1301 and 1303 can be aligned with and contact the insulating region 605. Further details of the fabrication process are provided below.

Cross-sectional views of a portion of the block along a path 1320 are discussed further below. The path 1320 extends across the trench 603 to a memory hole 811, then to the insulating region 604, and then back across the trench 603.

Figure 13B:
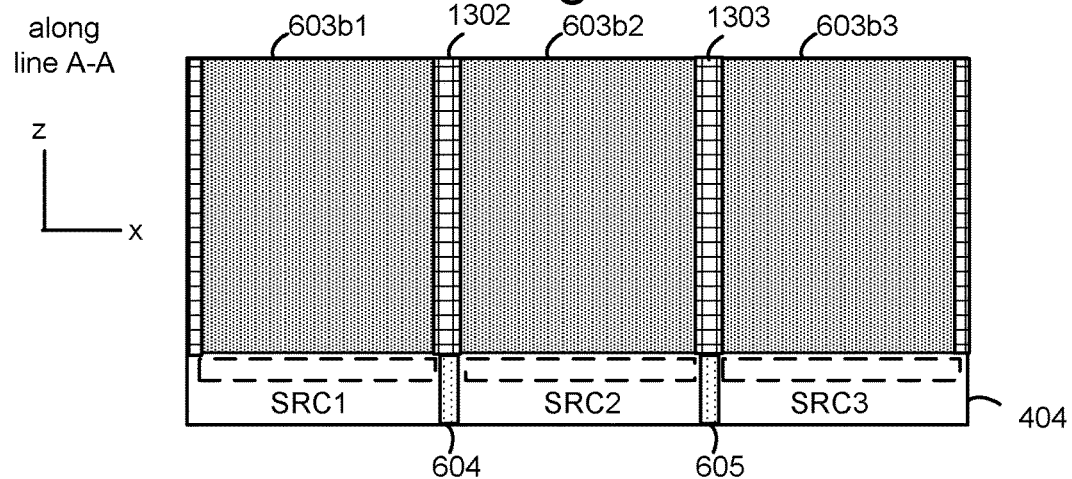
FIG. 13B depicts a cross-sectional view of the block of FIG. 13A along the line A-A.

FIG. 13B depicts a cross-sectional view of the block of FIG. 13A along the line A-A. The planar contacts 602b1-602b3 each extend from a top of the stack to the bottom of the stack and to a respective source region SRC1-SRC3, thus providing separate conductive paths for voltage signals to the respective source regions. Further, as mentioned, the planar contacts 603b1 and 603b2 are separated from one another by an insulating post 1302, and the planar contacts 603b2 and 603b3 are separated from one another by an insulating post 1303. The posts 1302 and 1303 can be upright cylinders comprising insulating material, in one approach. The posts can have a cross-sectional shape other than circular, such as square, rectangular or oval.

Figure 13C:
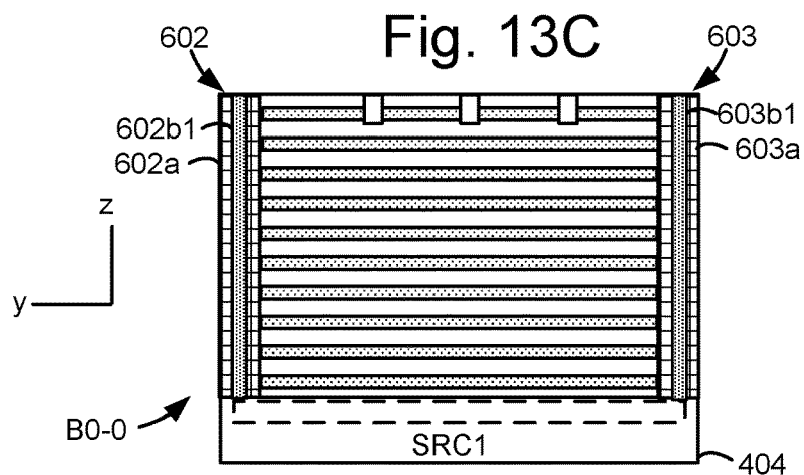
FIG. 13C depicts a cross-sectional view of the block of FIG. 13A along the line B-B.

FIG. 13C depicts a cross-sectional view of the block of FIG. 13A along the line B-B. The planar contacts 602b1 and 603b1 extend the height of the block and are surrounded on their sides by the insulating materials 602a and 603a, respectively.

FIG. 13D depicts a detail of a region of the block of FIG. 13A along the path 1320. Locations "1" to "7" are identified along the path. The path 1320 extends across the trench 603, starting at the outer wall insulating material 603a1 of the trench at the location "1" (see the outer wall 690), traversing the planar contact 603b2, reaching the inner wall insulating material 603a2 of the trench at location "2" (see the inner wall 691), reaching the memory hole 811 (location "3"), reaching an edge of the insulating region 604 (location "4"), extending along the middle of the insulation region 604 to a widened inner wall insulating material 603a3 (see the widened inner wall 1390) of the trench 603 (location "5"), traversing the insulating post 1302 (location "6"), and reaching a widened outer wall insulating material 603a4 (see the widened outer wall 1391) of the trench 603 (location "7").

The trench 603 has a width w1 along most of its length, apart from a widened region near the insulating post 1302 having a width w4. In particular, the trench 603 has a width w4>w1 at the region of the insulating post 1302 along a center line of the insulating region 604 in the y direction. The planar contacts 603b1 and 603b2 have a width of w2. The insulating post 1302 has a diameter or width of w3>w2. The widths are in the y direction. Each post can be wider than the width of a planar contact in the y direction to ensure that adjacent planar contacts are separated from one another and not short circuited to one another. For example, the insulating post 1302 with a width w3 is wider than the width w2 of the adjacent planar contacts 603b1 and 603b2 which contact opposing sides of the post. The formation of the insulating post 1302 is facilitated by increasing the width of the trench 603 in the region of the insulating post 1302, to provide the widened inner wall insulating material 603a3 and the widened outer wall insulating material 603a4 of the insulating material 603a.

FIG. 13E depicts a cross-sectional view of the block region of FIG. 13D in an Example II(A). The block comprises a stack 1200 formed on a substrate 404. The stack comprises conductive layers, shown as shaded rectangles (used as word lines and select gate lines) separated by dielectric layers, shown as open rectangles. From location "1" to "2", the outer wall insulating material 603a1, planar contact 603b2 and inner wall insulating material 603a2 of the trench 603 are provided. The memory hole 811 and NAND string NS are provided at location "3." The insulating region 604 is formed in a portion of the substrate from location "4" to "7". The widened inner wall insulating material 603a3, insulating post 1302 and widened outer wall insulating material 603a4 are depicted at locations "5," "6" and "7," respectively.

In addition to the insulating region 604, the substrate includes a doped crystalline silicon region 1310, such as p-type silicon. An epitaxial region 1311 of the substrate extends upward from a top surface of the substrate to a height above the SGS layer, for example. A bottom of the NAND string and memory hole are in contact with the epitaxial region and SRC2.

The insulating region 604 extends in the substrate to isolate the SRC2 region from the SRC1 region, as mentioned.

FIG. 13F to 13O1 describe a sequence for fabricating the block region of 13E. The locations "1" to "7" along the path 1320 are consistent with FIG. 13D.

FIG. 13F depicts an initial configuration of a block region consistent with FIG. 12B, where a substrate 404 of crystalline silicon is formed. The silicon may be in situ doped to provide p-type silicon.

FIG. 13G depicts a configuration of a block region which follows the configuration of FIG. 13F, where an insulation region is formed in the substrate. The insulating region 604 is formed by etching a trench in the substrate in the y-direction of FIG. 11A, and filling the trench with an insulating material. The insulating region 604 extends from a height which is below the bottom of the SRC2 region to a height which is above the top of the SRC2 region.

FIG. 13H depicts a configuration of a block region which follows the configuration of FIG. 13G, where a stack of layers is formed on the substrate and a memory hole 811 is formed in the stack. The stack of layers includes sacrificial layers "s" alternating with dielectric layers, as mentioned.

FIG. 13I depicts a configuration of a block region which follows the configuration of FIG. 13H, where an epitaxial region 1311 is formed at the bottom of each memory hole.

FIG. 13J1 depicts a configuration of a block region which follows the configuration of FIG. 13I, where a trench is formed in the stack. The trench 1330 has a width w1, consistent with FIG. 13D, and extends from the top of the stack to below the bottom of the stack, into the insulating region 604 and the silicon region 1310.

FIG. 13J2 depicts a top view of the block region of FIG. 13J1. The trench 1330 having the width w1 is depicted.

FIG. 13J3 depicts a configuration of a block region which follows the configuration of FIG. 13J1, where an outer post-shaped void is formed to provide a widened portion 1325 of the trench. The outer post-shaped void 1331 of width w2>w1 extends vertically in the stack, from the top of the stack to below the bottom of the stack, into the insulating region 604. The outer post-shaped void overlaps with the trench and is wider than the trench so that it forms a widened region (e.g., a bulge or rounded protuberance) of the trench 1330. The outer post-shaped void is formed between the source regions SRC1 and SRC2, and aligned with the insulating region 604. The sacrificial material can be removed from sacrificial layers "s" in the stack in this configuration. An inner post-shaped void, described further below, can be formed within an area of the outer post-shaped void.

FIG. 13J4 depicts a top view of the block region of FIG. 13J3. The outer post-shaped void 1331 having the width w2>w1 is depicted.

FIG. 13K depicts a configuration of a block region which follows the configuration of FIG. 13J3, where a metal is deposited in the layers of the stack via the trench 1330 and the outer post-shaped void 1331. The metal is deposited to form conductive layers comprising the word line and select gate layers. The conductive layers, shown as shaded rectangles, are formed when the metal fills the voids created when the sacrificial layers are removed. A metal layer 1340 is also formed in the trench as a byproduct.

FIG. 13K1 depicts a top view of the block region of FIG. 13K. The metal layer 1340 is depicted. The metal layer attaches to the sides and bottom of the trench as a byproduct of the metal deposition.

FIG. 13L depicts a configuration of a block region which follows the configuration of FIG. 13K, where the metal is removed from the trench such as by etching. The empty trench 1330 and outer post-shaped void 1331 are formed again, as in FIG. 13J3.

FIG. 13M depicts a configuration of a block region which follows the configuration of FIG. 13L, where an insulation layer is deposited in the trench. Locations "1," "2," "5," and "7" depict the outer wall insulating material 603a1, inner wall insulating material 603a2, widened inner wall insulating material 603a3, and widened outer wall insulating material 603a4, respectively.

FIG. 13M1 depicts a top view of the block region of FIG. 13M. The outer wall insulating material 603a1, inner wall insulating material 603a2, widened inner wall insulating material 603a3, and widened outer wall insulating material 603a4 are depicted.

FIG. 13N depicts a configuration of a block region which follows the configuration of FIG. 13M, where a conductive material is deposited in the trench. A portion 1350 of the conductive material in the post-shaped void does not entirely fill the void in this example. Alternatively, the conductive material fills the post-shaped void. A portion 1351 of the conductive material in the trench 1330 fills the trench in this example, contacting SRC2, thereby forming the planar contact 603b2. The conductive material can comprises, e.g., a metal or a doped polysilicon. For example, a p-type polysilicon may comprise polysilicon doped with Boron.

FIG. 13N1 depicts a top view of the block region of FIG. 13N. The portions 1350 and 1351 of the conductive material are depicted.

FIG. 13O depicts a configuration of a block region which follows the configuration of FIG. 13N, where an inner post-shaped void is formed to remove a portion of the conductive layer in the widened region of the trench, thereby forming a separate planar contact for each source region of the block. An inner post-shaped void 1332 is etched through the trench, at the center of the outer post-shaped void, to remove the portion 1350 of the conductive material. As a result, the planar contact 603b2 to SRC2 is formed, separate from the planar contact 603b1. The inner post-shaped void prevents electrical contact between the two adjacent planar contacts 603b1 and 603b2. For this purpose, the width or diameter w3 of the inner post-shaped void is greater than the width w2 of the planar contact 603b1 and 603b2, in the y direction. Each inner post-shaped void separates the conductive material in the trench into two adjacent planar contacts.

The inner post-shaped void can be formed within an area of the outer post-shaped void and can have a common longitudinal axis with the outer post-shaped void. The inner post-shaped void and the outer post-shaped void can be aligned with the insulating region 604.

The configuration of FIG. 13E is obtained following the configuration of FIG. 13O by depositing insulation in the inner post-shaped void to form the insulating post 1302.

FIG. 13O1 depicts a top view of the block region of FIG. 13O. The inner post-shaped void 1332 is depicted.

Figure 14A:
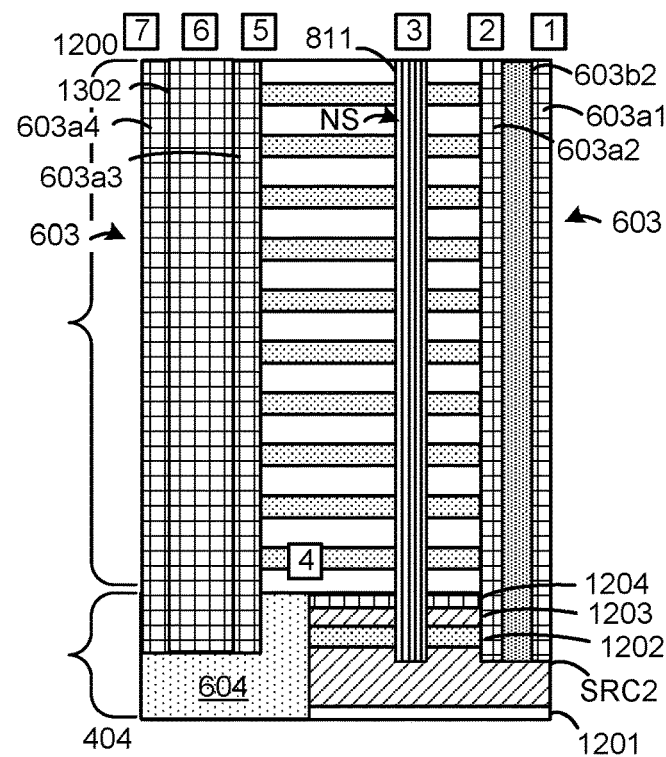
FIG. 14A depicts a cross-sectional view of the block region of FIG. 13D in an Example II(B), where an insulating region is formed in a substrate comprising multiple layers, and a stack is formed on the substrate.

FIG. 14A depicts a cross-sectional view of the block region of FIG. 13D in an Example II(B), where an insulating region is formed in a substrate comprising multiple layers, and a stack is formed on the substrate. This configuration can be obtained after the configurations of FIGS. 12C-12F, and 14B-14E. FIG. 14A is similar to FIG. 13E except for the substrate.

The substrate 404 includes the insulating region 604 along with the metal layer 1210, the source region SRC2, the insulating layer 1202, the polysilicon cover layer 1203 and the insulating layer 1204. The widened inner wall insulating material 603a3, insulating post 1302 and widened outer wall insulating material 603a4 extend down to the insulating region 604. The memory hole 811 and associated NAND string NS extend down to SRC2. The outer wall insulating material 603a1, planar contact 603b2 and inner wall insulating material 603a2 also extend down to SRC2 to provide a contact to SRC2 which can carry a voltage signal.

Figure 14B:
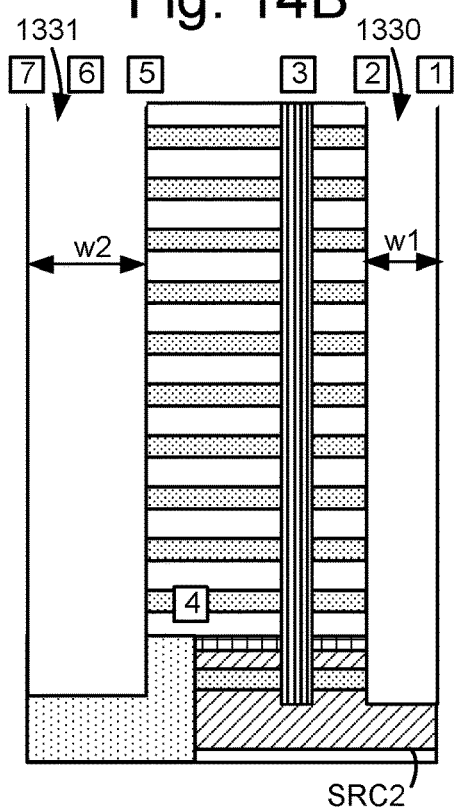
FIG. 14B depicts a configuration of a block region for forming the configuration of FIG. 14A, where a trench and an outer post-shaped void are formed which extend vertically in the stack, and the outer post-shaped void is formed between source regions.

FIG. 14B depicts a configuration of a block region for forming the configuration of FIG. 14A, where a trench 1330 and an outer post-shaped void 1331 are formed which extend vertically in the stack, and the outer post-shaped void is formed between source regions. This configuration is similar to the configuration of FIG. 13L, where the outer post-shaped void 1331 of width w2>w1 is formed which extends vertically in the stack, from the top of the stack to below the bottom of the stack, into the insulating region 604. The trench 1330 has a width w1 and extends vertically in the stack, from the top of the stack to below the bottom of the stack, into SRC2. In this configuration, the metal has been deposited to form the word lines and select gate lines, and the byproduct metal has been cleaned from the voids.

Figure 14C:
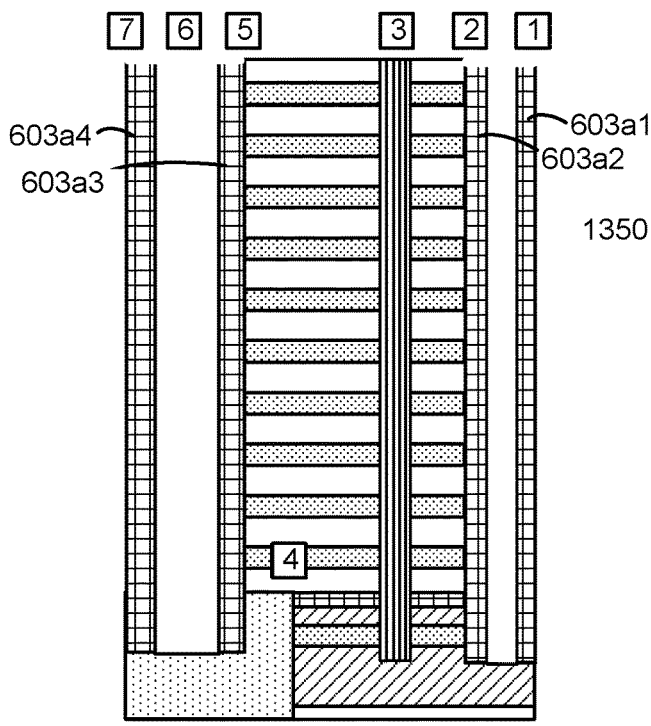
FIG. 14C depicts a configuration of a block region which follows the configuration of FIG. 14B, where an insulating layer is deposited in the trench and etched through at the bottom.

FIG. 14C depicts a configuration of a block region which follows the configuration of FIG. 14B, where an insulating layer is deposited in the trench and etched through at the bottom. This configuration is similar to the configuration of FIG. 13M. An insulating material is deposited in the trench 1330 and outer post-shaped void 1331 and etched through at the bottom. The outer wall insulating material 603a1, inner wall insulating material 603a2, widened inner wall insulating material 603a3, and widened outer wall insulating material 603a4 are formed.

Figure 14D:
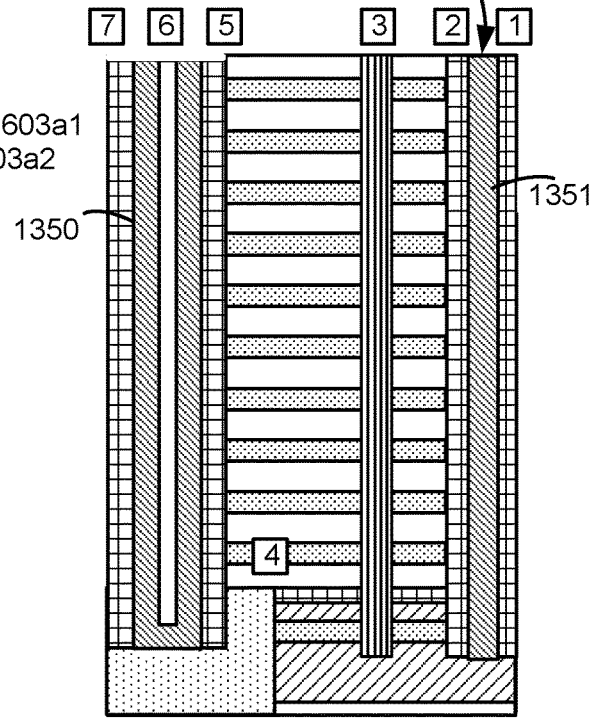
FIG. 14D depicts a configuration of a block region which follows the configuration of FIG. 14C, where a conductive material is deposited in the trench.

FIG. 14D depicts a configuration of a block region which follows the configuration of FIG. 14C, where a conductive material is deposited in the trench. This configuration is similar to the configuration of FIG. 13N. A portion 1350 of the conductive material in the outer post-shaped void 1331 does not entirely fill the void in this example. A portion 1351 of the conductive material in the trench 1330 fills the trench in this example, contacting SRC2, thereby forming the planar contact 603b2.

Figure 14E:
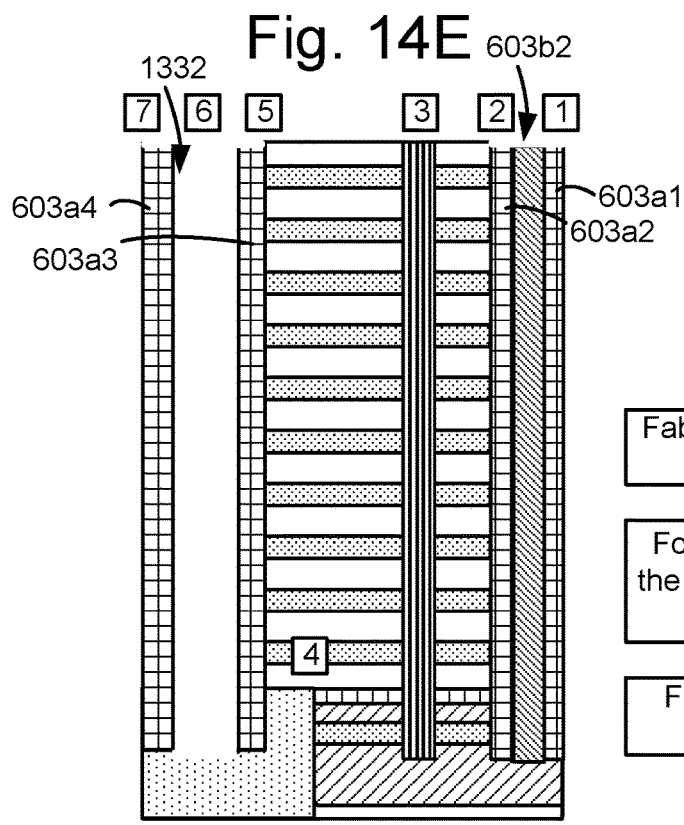
FIG. 14E depicts a configuration of a block region which follows the configuration of FIG. 14D, where an inner post-shaped void is formed to remove a portion of the conductive layer in the outer post-shaped void, thereby forming a separate planar contact for each source region of the block.

FIG. 14E depicts a configuration of a block region which follows the configuration of FIG. 14D, where an inner post-shaped void is formed to remove a portion of the conductive layer in the outer post-shaped void, thereby forming a separate planar contact for each source region of the block. This configuration is similar to the configuration of FIG. 13O. An inner post-shaped void 1332 is etched through the outer post-shaped void of the trench to remove the portion 1350 (FIG. 14D) of the conductive material. As a result, the planar contact 603b2 to SRC2 is formed, separate from the planar contact 603b1. The inner post-shaped void prevents electrical contact between the two adjacent planar contacts 603b1 and 603b2. As shown in FIG. 13O1, the width or diameter w3 of the inner post-shaped void is greater than the width w2 of the planar contact 603b1 and 603b2, in the y direction. Each inner post-shaped void separates the conductive material in the trench into two adjacent planar contacts.

The configuration of FIG. 14A is obtained following the configuration of FIG. 14E by depositing insulation in the inner post-shaped void 1332.

Figure 15A:
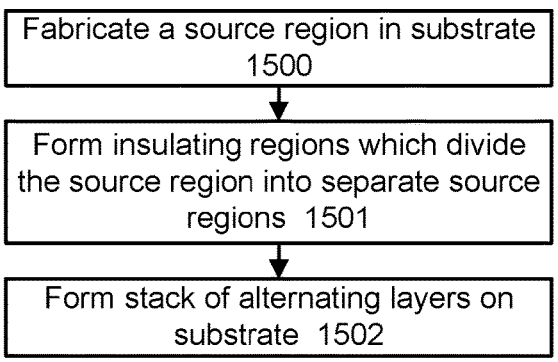
FIG. 15A depicts a process for fabricating a stack of alternating layers on a substrate which comprises separate source regions.

FIG. 15A depicts a process for fabricating a stack of alternating layers on a substrate which comprises separate source regions. Step 1500 includes fabricating a source region in a substrate. In one approach, a single source region such as SRC in FIG. 11B is fabricated. Another approach is to form separate source regions. A source region can be a source diffusion region which includes at least one doped well in the substrate. The doped well can be p-type or n-type and have a substantially uniform level of dopant concentration. The dopant concentration can be about $1.0\times10^{15}/cm3$ to $1.0\times10^{18}/cm3$. In another approach, the source region comprises distinct source lines such as in FIG. 10.

Step 1501 includes forming insulating regions which divide the source region into separate source regions. For example, see the insulating regions 604 and 605 of FIGS. 8A and 8B.

Figure 15B:
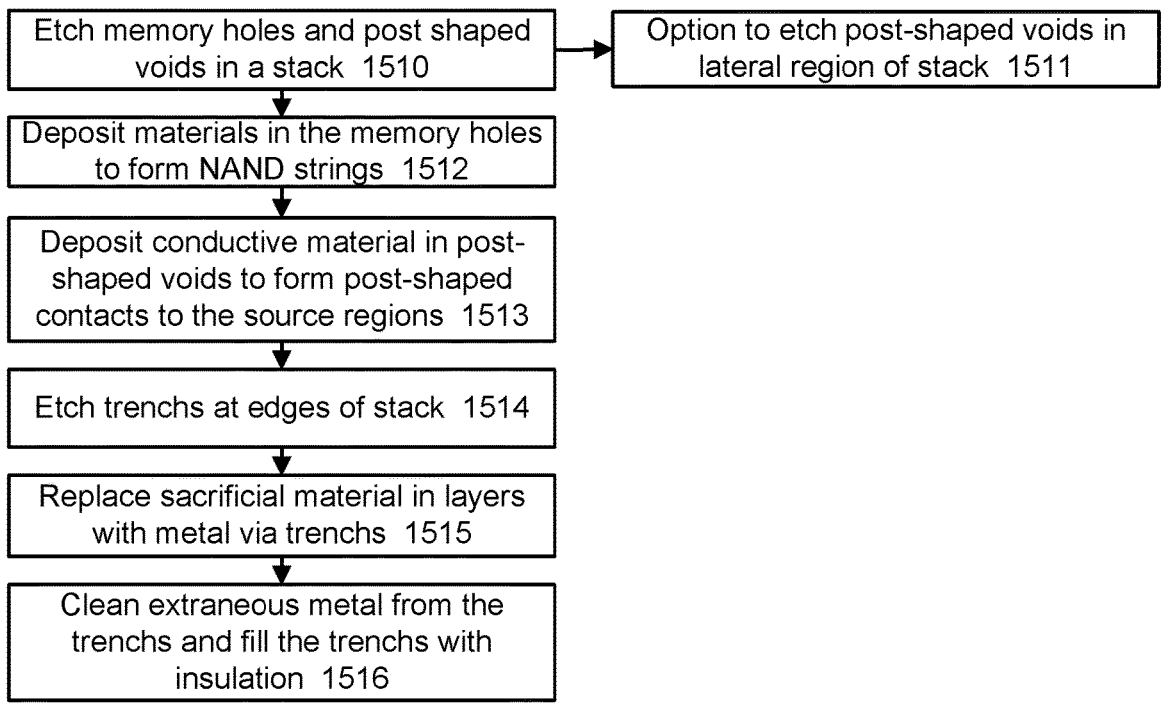
FIG. 15B depicts a process for fabricating post-shaped contacts to the source regions in the process of FIG. 15A.
Figure 15C:
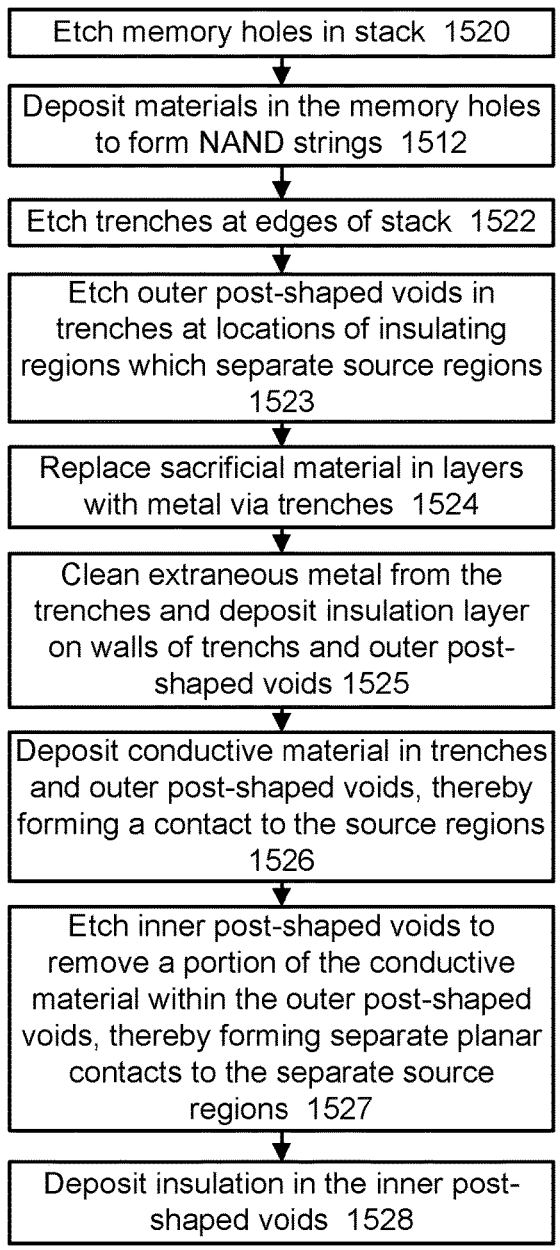
FIG. 15C depicts a process for fabricating planar contacts to the source regions in the process of FIG. 15A.

Step 1502 includes forming a stack of alternating layers on the substrate. Layers of a dielectric material such as oxide can alternate with layers of a sacrificial material such as SiN. For example, see the stack 1200 of FIG. 12B. The process of FIG. 15A can then be followed by the process of FIG. 15B or 15C. FIG. 15B encompasses Examples 1(A)-(C) which include post-shaped contacts for the source regions. FIG. 15C encompasses Examples 1I(A) and (B) which include planar contacts for the source regions.

FIG. 15B depicts a process for fabricating post-shaped contacts to the source regions in the process of FIG. 15A. Step 1510 includes etching memory holes and post-shaped voids in a stack. For example, see the memory hole MH and the post-shaped void 801v of FIG. 8A. Step 1511 includes an option to etch post-shaped voids in a lateral region of the stack. Step 1512 includes depositing materials in the memory holes to form NAND strings. See FIG. 5C. Step 1513 includes depositing a conductive material in the post-shaped voids to form post-shaped contacts to the source regions. For example, see the post-shaped contacts 801-804 of FIG. 8A. Step 1514 includes etching trenches at edges of the stack, e.g., at one or both of the long edges. For example, see the trench 1220 of FIG. 12G. Step 1515 includes replacing the sacrificial materials in the layers with metal via the trenches. For example, see FIG. 12H. Step 1516 includes cleaning byproduct metal from the trenches and filling the trenches with insulation. For example, see the insulating material 603i in the trench 603 in FIGS. 12A and 12B.

FIG. 15C depicts a process for fabricating planar contacts to the source regions in the process of FIG. 15A. Step 1520 includes etching memory holes in a stack. Step 1521 includes depositing materials in the memory holes to form NAND strings. Step 1522 includes etching trenches at edges of the stack. A trench can extend fully through the stack, in the z direction. A trench can also extend a length of the stack or block, e.g., in the x direction of FIG. 11A. Step 1523 includes etching outer post-shaped voids in the trenches at locations of the insulating regions which separate source regions. For example, see the outer post-shaped void 1331 of FIGS. 13J3 and 13J4. Step 1524 includes replacing the sacrificial materials in the layers with metal via the trenches. For example, see FIG. 13K. Step 1525 includes cleaning byproduct metal from the trenches and depositing an insulation layer on walls of the trenches and the outer post-shaped voids. For example, see the outer wall insulating material 603a1, inner wall insulating material 603a2, widened inner wall insulating material 603a3, and widened outer wall insulating material 603a4 in FIG. 13M. This isolated the word lines from the conductive material which is deposited in the next step. Step 1526 includes depositing a conductive material in the trenches and the outer post-shaped voids, thereby forming a contact to the source regions. For example, see the portions 1350 and 1351 of conductive material and the planar contact 603b2 in FIG. 13N. At this point, there is a single contact at each edge of the stack which is common to each source region. A conductive material can extend a full length of the stack or block.

Step 1527 includes etching inner post-shaped voids to remove a portion of the conductive material within the outer post-shaped voids, thereby forming separate planar contacts to the separate source regions. For example, see the inner post-shaped void 1332 of FIGS. 13O and 13O1 and the separate planar contacts 602b1-602b3 and 603b1-603b3 in FIG. 13A The voids, including trenches, described herein can be formed using lithographic techniques. For example, a mask comprising photoresist can be deposited on the block or substrate. The mask can be exposed and developed to form a pattern with openings at the desired locations of the voids. An etching process can then performed to transfer the pattern of the mask to the block or substrate. The mask can then be removed by a cleaning process.

Figure 16:
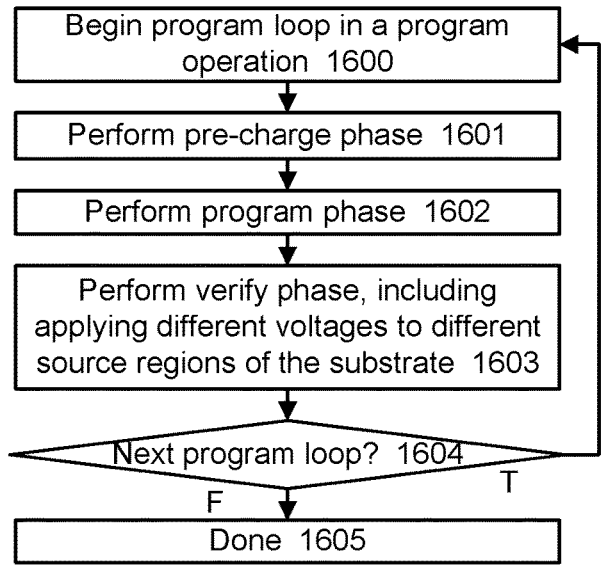
FIG. 16 depicts a process for programming a block.
Figure 17:
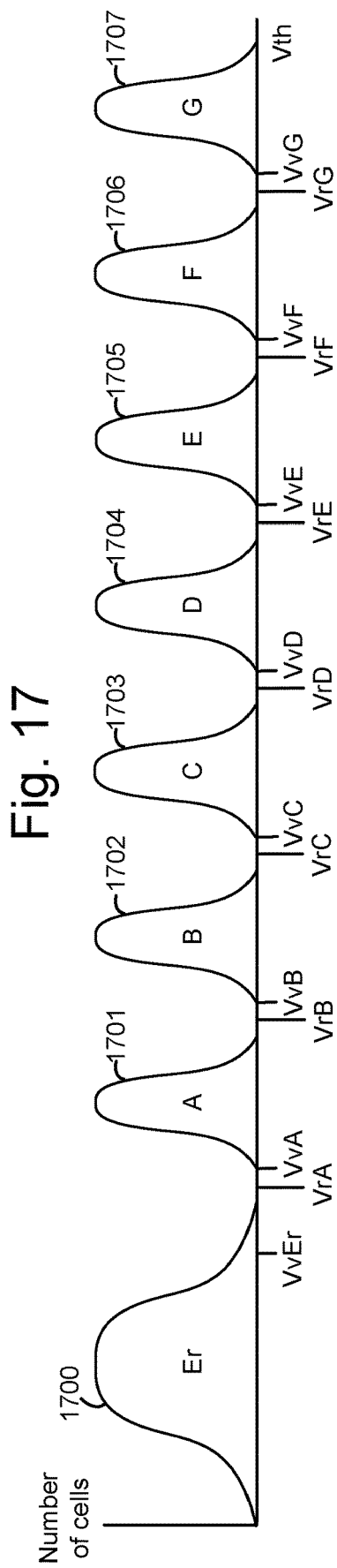
FIG. 17 depicts threshold voltage (Vth) distributions for an eight-state memory device.

FIG. 16 depicts a process for programming a block. Step 1600 begins a program loop in a program operation. The program operation can result in different Vth levels for the memory cells, such as depicted in FIG. 17. Step 1601 includes performing a pre-charge phase. Step 1602 includes performing a program phase. Step 1603 includes performing a verify phase, including applying different voltages to different source regions of the substrate. For example, as discussed in connection with FIG. 7B, the voltages can be based on the distance of the source region and its associated block region and NAND strings from a word line driver. A decision step 1604 determines if a next program loop is to be performed. If the decision step 1604 is true, step 1600 is reached. If the decision step 1604 is false, the program operation is done at step 1605. Example details of the pre-charge phase 1807, program phase 1808 and verify phase 1809 are provided in FIG. 18.

FIG. 17 depicts threshold voltage (Vth) distributions for an eight-state memory device. Eight data states, or three bits per cell, are depicted as an example. In another example, two data states (one bit per cell), four data states (two bits per cell) or sixteen data states (four bits per cell) per memory cell are used. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution 1700 is obtained, representing the erased state. The erase operation is completed when the Vth of all, or nearly all, of the memory cells is below a verify voltage of VvEr.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vth distributions 1701-1707, respectively. These memory cells are subject to verify tests using verify voltages of VvA-VvG. The memory cells can be read using read voltages VrA-VrG. During the verify tests, different voltages can be applied to the different source regions, as described herein. It is also possible to apply different voltages to the different source regions in other sensing operations such as to read operation.

FIG. 18 depicts example voltage signals for performing a program operation using different source region voltages, consistent with FIG. 16. The vertical dimension denotes voltage and the horizontal dimension denotes time, with time points t0-t12. The period of time depicted corresponds to one program loop and includes a pre-charge phase 1807 (t0-t2), a program phase 1808 (t2-t8) and a verify phase 1809 (t9-t12). Voltage signals 1800, 1810, 1820, 1830, 1840 and 1850 depict VWLn (the voltage of the selected word line), VWL_unsel (the voltage of the unselected word lines), Vsgd (the voltage of the SGD transistors), Vsgs (the voltage of the SGS transistors), Vbl (the bit line voltage) and Vsrc (the source region voltage), respectively. VWL_unsel can include data and dummy word lines.

The pre-charge phase is used to charge up the channels of the NAND string. In the pre-charge phase, plot 1801 depicts a positive voltage such as 1-2 V for VWLn. In the program phase, VWLn is increased from 0 V (plot 1802) to a pass voltage, Vpass (plot 1804), at t3 and then to a peak level, Vpgm (plot 1805), at t5. VWLn is then decreased back to 0 V at t6 before the verify phase 1809. In the verify phase, a verify signal 1806 is applied to the selected word line, and the selected memory cells are sensed during the different verify voltages of the verify signal. In this example, the verify voltages are VvE, VvF and VvG.

For VWL_unsel, plot 1811 depicts a positive voltage such as 1-2 V in the pre-charge phase. In the program phase, VWL_unsel is increased from 0 V (plot 1812) to Vpass (plot 1814), then decreased back to 0 V at t12 at the end of the verify phase 1809.

For Vsgd, plot 1821 depicts a positive voltage such as 4-6 V for all SGD transistors in a block. This allows Vbl to be passed to the channels. For SGD transistors of selected NAND strings, plot 1822 depicts Vsgd_sel, e.g., 2.5 V during the program phase. Vsgd_sel is high enough to provide the associated SGD transistors in a conductive state for the selected NAND strings, which receive a program-enable voltage of Vbl_en=0 V. For SGD transistors of unselected NAND strings, plot 1823 depicts Vsgd_unsel, e.g., 0 V during the program phase. This provides the associated SGD transistors in a non-conductive state for the unselected NAND strings. This allows the associated channels to be boosted by capacitive coupling when VWLn and VWL_unsel are ramped up from 0 V to Vpass. This is in addition to the boosting from the pre-charge phase. A plot 1824 shows Vsgd_sel at an elevated level such as 4-6 V during the verify phase to allow sensing to occur in the associated NAND strings. A plot 1825 shows Vsgd_unsel at 0 V during the verify phase since sensing does not occur in the associated NAND strings.

For Vsgs, in one approach, all SGS transistors in a block are connected and receive the same voltage. In the pre-charge phase, plot 1831 depicts a positive voltage such as 4-6 V for all SGS transistors in a block. This allows a voltage to be passed to the channels from the substrate.

Plot 1834 depicts Vsgs=0 V during the program phase. A plot 1835 shows Vsgd at an elevated level such as 4-6 V during the verify phase to allow sensing to occur in the selected NAND strings.

Vbl represents the bit line voltage, which can be set separately for selected and unselected NAND strings. In the pre-charge phase, plot 1841 depicts a positive pre-charge voltage, Vbl_pc, such as 2 V for selected NAND strings. Plot 1843 depicts 0 V for bit lines connected to unselected NAND strings. In the program phase, a plot 1842 depicts a program-inhibit voltage Vbl_inh=1.5 V, for example, for the unselected NAND strings, and a plot 1843 depicts a program-enable voltage Vbl_en=0 V, for example, for the selected NAND strings. A plot 1844 shows Vbl=0.5 V, for example, during the verify phase.

For Vsrc, in the pre-charge phase in a first time period from t0-t1, plot 1851 depicts a positive pre-charge voltage such as 2 V. In the program phase, a plot 1854 depicts Vsrc at a positive voltage to help maintain the SGS transistors in a non-conductive state. In this example, a common voltage Vsrc is applied to the different source regions during the pre-charge and program phases. However, it is possible to apply different voltages to the different source regions during the pre-charge and/or program phases. In the verify phase, plots 1855, 1856 and 1857 depict the voltages Vsrc1, Vsrc2 and Vsrc3 for the source regions SRC1, SRC2 and SRC3, respectively. Thus, different voltages can be applied to the different source regions during the verify phase, as discussed, e.g., in connection with FIG. 7B. The voltages depicted are examples.

It is also possible to apply different voltages to the different source regions during other sensing operations such as a read operation, and during an erase operation.

Accordingly, it can be see that in one implementation, an apparatus comprises: a substrate; separate source regions in the substrate; and a block on the substrate, where the block comprising a set of NAND strings arranged vertically, different subsets of the set of NAND strings are in contact with different source regions of the separate source regions.

In another implementation, a method comprises: forming separate source regions in a substrate; forming a stack of alternating layers on the substrate; etching a trench in the stack, the trench extending a height and length of the stack; depositing conductive material in the trench, the conductive material extending the height and length of the block; and separating the conductive material into separate contacts, where each contact is connected to a respective source region of the separate source regions.

In another implementation, an apparatus comprises: a control circuit configured to connect to a plurality of source region voltage drivers for a plurality of source regions in a substrate, a block of memory cells is on the substrate; and a memory interface connected to the circuit. The control circuit is configured to issue a command via the memory interface to instruct each source region voltage driver of the plurality of source region voltage drivers to provide a respective voltage signal to a respective source region among a plurality of source regions.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a substrate;
separate source regions in the substrate including at least a first source region and a second source region;
an insulating region in the substrate between the first source region and the second source region to electrically isolate the first source from the second source region; and
a block on the substrate, the block comprising a set of NAND strings arranged vertically, different subsets of the set of NAND strings are in contact with different source regions of the separate source regions including at least a first subset of the NAND strings in contact with the first source region and a second subset of the NAND strings in contact with the second source region.

2. The apparatus of claim 1, further comprising:
a set of bit lines, wherein the different subsets of the set of NAND strings are in contact with different subsets of the set of bit lines.

3. The apparatus of claim 1, wherein:
each source region comprises a diffusion region in the substrate extending at least a width of the block.

4. The apparatus of claim 1, wherein the first subset of NAND strings are located above the first source region and the second subset of NAND strings are located above the second source region.

5. The apparatus of claim 4, further comprising:
a set of bit lines extending in a bit line direction, wherein the insulating region extends in the bit line direction.

6. The apparatus of claim 1, further comprising:
contacts extending vertically in the block, each contact is connected to a respective source region of the separate source regions.

7. The apparatus of claim 6, wherein:
the contacts comprise post-shaped contacts.

8. The apparatus of claim 6, wherein:
the contacts comprise a plurality of planar contacts.

9. The apparatus of claim 8, further comprising:
an insulating post which separates adjacent planar contacts of the plurality of planar contacts.

10. The apparatus of claim 9, wherein:
the adjacent planar contacts each comprise a conductive material; and
the insulating post has a width which is greater than a width of the conductive material.

11. The apparatus of claim 1, further comprising:
separate voltage drivers for the separate source regions including at least a first voltage driver connected to the first source region and a second voltage driver connected to the second source region.

12. A method, comprising:
forming a source region in a substrate;
forming one or more insulating regions in the source region to divide the source region into a plurality of separate source regions including at least a first source region that is separated from a second source region by an insulating region; and
forming a block on the substrate over the first source region and the second source region, the block comprising a set of NAND strings arranged vertically, the set of NAND strings including at least a first subset of NAND strings overlying and in contact with the first source region and a second subset of NAND strings overlying and in contact with the second source region.

13. The method of claim 12, further comprising:
etching a trench in a stack that includes the set of NAND strings of the block, the trench extending a height and length of the stack;
depositing conductive material in the trench, the conductive material extending the height and length of the block; and
separating the conductive material into separate contacts, where each contact is connected to a respective source region of the separate source regions including at least a first contact connected to the first source region and a second contact connected to the second source region.

14. The method of claim 13, wherein:
the separating the conductive material comprises etching a post-shaped void in the conductive material.

15. The method of claim 14, wherein:
the post-shaped void has a width which is greater than a width of the conductive material.

16. The method of claim 15, wherein: the post-shaped void is etched in a widened region of the trench.

17. An apparatus, comprising:
a control circuit configured to connect to a plurality of source region voltage drivers for a plurality of source regions that are located in an area of a substrate under a block, the plurality of source region voltage drivers including at least a first source region voltage driver connected to a first source region and a second source region voltage driver connected to a second source region; and
a memory interface connected to the control circuit, the control circuit is configured to issue a command via the memory interface to instruct each source region voltage driver of the plurality of source region voltage drivers to provide a respective voltage signal to a respective source region among a plurality of source regions including providing a first voltage signal to the first source region and a second voltage signal to the second source region, the second voltage signal is different to the first voltage signal.

18. The apparatus of claim 17, wherein:
the control circuit is configured to instruct each source region voltage driver to provide the respective voltage signal to the respective source region during a verify phase of a program loop of a program operation.

19. The apparatus of claim 17, wherein:
the control circuit is configured to instruct each source region voltage driver to provide the respective voltage signal to the respective source region during a sensing operation.

20. The apparatus of claim 17, wherein
during a sensing operation for memory cells associated with one of the source regions, the control circuit is configured to instruct a respective source region voltage driver to set a voltage of the respective voltage signal as a function of a distance of the one of the source regions from a word line driver.

* * * * *